(12) United States Patent
Ogimoto

(10) Patent No.: US 8,963,221 B2
(45) Date of Patent: Feb. 24, 2015

(54) STRONGLY CORRELATED NONVOLATILE MEMORY ELEMENT

(71) Applicant: Fuji Electric Co., Ltd., Kawasaki-shi (JP)

(72) Inventor: Yasushi Ogimoto, Higashiyamato (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 14/231,845

(22) Filed: Apr. 1, 2014

(65) Prior Publication Data

US 2014/0209850 A1 Jul. 31, 2014

Related U.S. Application Data

(63) Continuation of application No. PCT/JP2012/073640, filed on Sep. 14, 2012.

(30) Foreign Application Priority Data

Oct. 19, 2011 (JP) ................................. 2011-230068

(51) Int. Cl.
*H01L 21/02* (2006.01)
*H01L 45/00* (2006.01)
(Continued)

(52) U.S. Cl.
CPC ........ *H01L 45/1206* (2013.01); *G11C 11/5685* (2013.01); *G11C 13/0002* (2013.01);
(Continued)

(58) Field of Classification Search
CPC . H01L 45/147; H01L 45/065; H01L 45/1206; H01L 43/08; H01L 27/101
USPC ......................................................... 257/295
See application file for complete search history.

(56) References Cited

U.S. PATENT DOCUMENTS

| 5,418,389 A | 5/1995 | Watanabe |
| 5,665,664 A | 9/1997 | Tomioka et al. |

(Continued)

FOREIGN PATENT DOCUMENTS

| EP | 0 864 538 A1 | 9/1998 |
| JP | 06-151872 A | 5/1994 |

(Continued)

OTHER PUBLICATIONS

S. Mathews et al.,"Ferroelectric Field Effect Transistor Based on Epitaxial Perovskite Heterostructures", Science, vol. 276, 238 (1997). Cited in specification.

(Continued)

*Primary Examiner* — Nicholas Tobergte
(74) *Attorney, Agent, or Firm* — Rossi, Kimms & McDowell LLP

(57) ABSTRACT

In aspects of the invention, a strongly correlated nonvolatile memory element is provided which exhibits phase transitions and nonvolatile switching functions through electrical means. In an aspect of the invention, a strongly correlated nonvolatile memory element is provided including, on a substrate, a channel layer, a gate electrode, a gate insulator, a source electrode, and a drain electrode. The channel layer includes a strongly correlated oxide thin film, and is formed of a perovskite type manganite which exhibits a charge-ordered phase or an orbital-ordered phase; the gate insulator is formed in contact with at least a portion of a surface or interface of the channel layer and is sandwiched between the channel layer and the gate electrode, and the source electrode and drain electrode are formed in contact with at least a portion of the channel layer.

10 Claims, 13 Drawing Sheets

(51) Int. Cl.
  *G11C 11/56* (2006.01)
  *G11C 13/00* (2006.01)
  *H01L 43/08* (2006.01)
  *H01L 27/10* (2006.01)
  *H01L 29/786* (2006.01)

(52) U.S. Cl.
  CPC ............ *G11C13/0007* (2013.01); *H01L 43/08* (2013.01); *H01L 27/101* (2013.01); *H01L 45/147* (2013.01); *H01L 29/7869* (2013.01); *H01L 29/78696* (2013.01); *H01L 45/065* (2013.01); *G11C 2213/53* (2013.01)
  USPC ........................................................ 257/295

(56) References Cited

U.S. PATENT DOCUMENTS

| | | | |
|---|---|---|---|
| 6,136,457 A | 10/2000 | Miyano et al. | |
| 6,330,135 B1* | 12/2001 | Manako et al. | 360/313 |
| 7,309,903 B2* | 12/2007 | Tanaka et al. | 257/421 |
| 7,684,147 B2* | 3/2010 | Ahn et al. | 360/112 |
| 8,524,382 B2* | 9/2013 | Ogimoto | 428/700 |
| 2001/0026466 A1 | 10/2001 | Adachi et al. | |
| 2006/0017080 A1* | 1/2006 | Tanaka et al. | 257/295 |
| 2008/0105955 A1* | 5/2008 | Hao et al. | 257/627 |
| 2009/0065757 A1 | 3/2009 | Sawa et al. | |
| 2009/0231083 A1 | 9/2009 | Hosoi et al. | |
| 2012/0268980 A1 | 10/2012 | Awaya et al. | |
| 2013/0140661 A1* | 6/2013 | Ogimoto | 257/421 |

FOREIGN PATENT DOCUMENTS

| | | |
|---|---|---|
| JP | 08-133894 A | 5/1996 |
| JP | 10-261291 A | 9/1998 |
| JP | 2001-339110 A | 12/2001 |
| JP | 2005-213078 A | 8/2005 |
| JP | 2011-233551 A | 11/2011 |
| WO | 2004/023563 A1 | 3/2004 |
| WO | 2006/101152 A1 | 9/2006 |
| WO | 2007/026509 A1 | 3/2007 |

OTHER PUBLICATIONS

J. Matsuno et al., "Magnetic field tuning of interface electronic properties in manganite-titanate junctions", Applied Physics Letters, vol. 92, p. 122104 (2008). Cited in specification.

S. Asanuma et al., "Tuning of the metal-insulator transition in electrolyte-gated NdNiO3 thin films", Applied Physics Letters, vol. 97, 142110 (2010). Cited in specification.

International Search Report issued in PCT/JP2012/073640, dated Oct. 16, 2012. Prior art cited in ISR was previously cited in an earlier IDS. English translation provided.

* cited by examiner

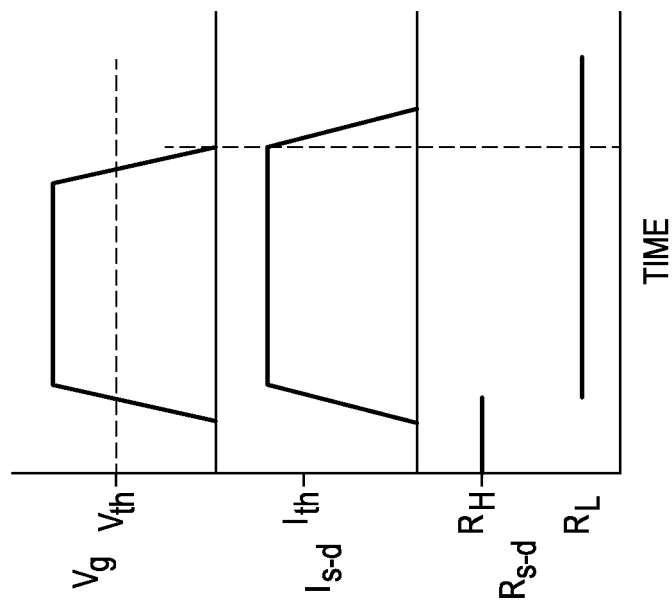
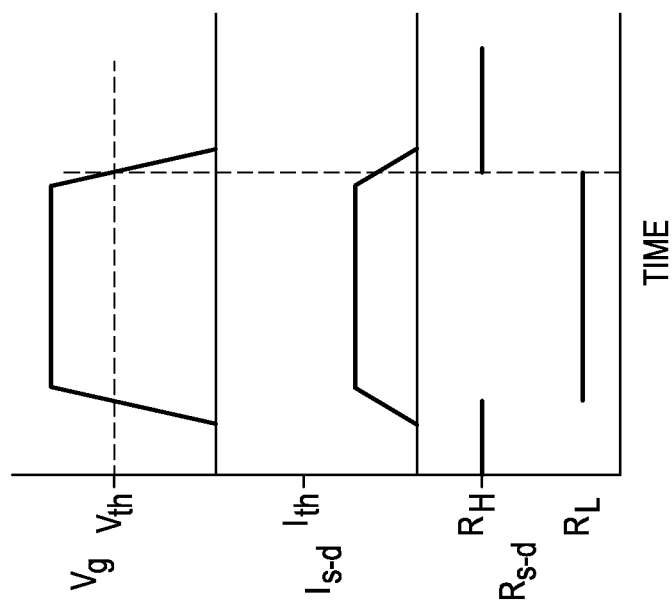
FIG.6(a)
FIG.6(b)

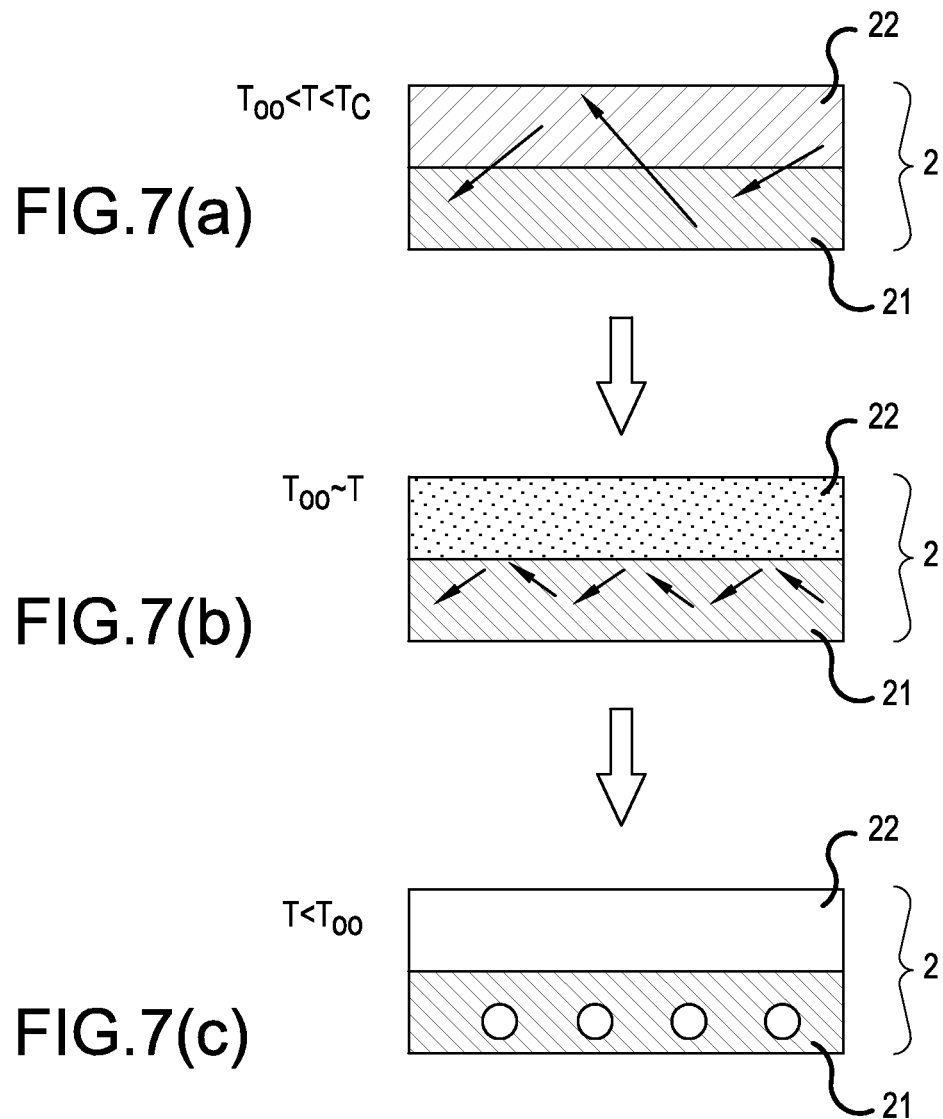

STRONGLY CORRELATED NONVOLATILE MEMORY ELEMENT

CROSS-REFERENCE TO RELATED CASES

This application is a continuation of International Application No. PCT/JP 2012/073640, filed on Sep. 14, 2012, which is based on and claims priority to Japanese Patent Application No. JP 2011-230068, filed on Oct. 19, 2011. The disclosure of the Japanese priority application and the PCT application in their entirety, including the drawings, claims, and the specification thereof, are incorporated herein by reference.

BACKGROUND

1. Field of the Invention

This invention relates to a strongly correlated nonvolatile memory element. More specifically, this invention relates to a strongly correlated nonvolatile memory element which exhibits nonvolatile memory functions by electrical means.

2. Related Art

In recent years there have been concerns that the scaling rule which has been a guiding principle for improvement of semiconductor device performance will finally reach a limit. These concerns have been accompanied by work to develop materials which make possible novel operation principles to overcome the crisis of limits to transistor performance. For example, in the field of spintronics which incorporate spin freedom, development is underway with the goal of high-density nonvolatile memory capable of fast operation comparable to DRAM (Dynamic Random Access Memory).

On the other hand, there has also been progress made in research on materials having strongly correlated electron systems, to which the band theory which has supported the foundations of semiconductor device design cannot be applied. As a result of this progress, materials have been discovered which exhibit huge and rapid changes in physical properties arising from phase transitions of electron systems. In strongly correlated electron system materials, the degrees of freedom of electron orbitals as well as spin contribute to the phase state of the electronic system, and consequently various electronic phases, indicating diverse orders formed by spin, electric charge, and orbitals, are exhibited. Perovskite manganite is a representative example of a strongly correlated electronic system material; it is known that due to first-order phase transitions, this electronic system exhibits a charge-ordered phase in which 3d electrons of manganese (Mn) are ordered, and an orbital-ordered phase in which electron orbitals are ordered.

In the charge-ordered phase and the orbital-ordered phase, carriers are localized, so that electrical resistance is increased, and the electronic phases are insulator phases. Further, the magnetic properties of these electronic phases are antiferromagnetic phases due to double exchange interactions and superexchange interactions. The electronic states of charge-ordered phases and orbital-ordered phases often should be regarded as semiconducting. This is because in charge-ordered phases and orbital-ordered phases, carriers are localized, but electric resistivity is lower than that of so-called band insulators. However, here the convention is adopted that the electronic phases of charge-ordered phases and orbital-ordered phases are insulator phases. Conversely, when electrical resistance is low and metal-like behavior is exhibited, spins are aligned, and so the electronic phase exhibits ferromagnetism. There are various definitions of metallic phases, but in the present application, a metallic phase is regarded as one for which "the sign of the differential temperature coefficient of resistivity is positive". Corresponding to this, the above-described insulator phase may be re-defined as one for which "the sign of the differential temperature coefficient of resistivity is negative".

Further, two-phase coexistence states, in which a metallic phase and an insulator phase coexist in a material, are also known. The electrical resistance values of materials which exist in a two-phase coexistence state are determined by percolation in the metallic phase in the material. For example, if between two electrodes provided in the material to measure the electrical resistance, metallic phase regions are connected to form even a single path, the resistance is reduced, whereas if such a path does not exist, the resistance is high. Whether a material in such a two-phase coexistence state behaves as a conductor or as an insulator, that is, the apparent electrical resistance value of the material, is determined by the geometric structure of paths of the metallic phase (typically, lengths, widths and number) brought about by such percolation. It is known that electrical resistance values can take on two or more values, according to the geometric structures of paths of metallic phase regions in a two-phase coexistence state.

In addition to the above-described charge-ordered phase and orbital-ordered phase, various switching phenomena have been reported in single-crystal bulk samples of materials which can enter an electronic phase in which both charge-ordering and orbital-ordering obtain (a charge- and orbital-ordered phase). See Japanese Patent Application Laid-open No. H8-133894 (also referred to herein as "Patent Document 1"), Japanese Patent Application Laid-open No. H10-255481 (also referred to herein as "Patent Document 2") and Japanese Patent Application Laid-open No. H10-261291 (also referred to herein as "Patent Document 3"). Such switching phenomena are exhibited according to application of such stimuli as temperature changes surrounding a transition point, application of a magnetic field or electric field, or optical irradiation. The switching phenomena are typically observed as giant changes in electrical resistance, and phase transitions between an antiferromagnetic phase and a ferromagnetic phase. For example, changes in resistance by several orders of magnitude due to application of a magnetic field are well known as the colossal magnetoresistance effect.

For some time now research has been conducted on electric field effect elements using such strongly correlated electron system materials as thin films in channel layers. For example, it is reported that when using an $La_{0.7}Ca_{0.3}MnO_3$ thin film as a channel layer, and fabricating a ferroelectric $PbZr_{0.2}Ti_{0.8}O_3$ (PZT) thin film thereupon as a gate insulator, nonvolatile resistance changes in the channel layer are induced by remanent polarization of the ferroelectric $PbZr_{0.2}Ti_{0.8}O_3$ thin film. See S. Mathews et al., "Ferroelectric Field Effect Transistor Based on Epitaxial Perovskite Heterostructures", Science, vol. 276, 238 (1997) (also referred to herein as "Non-Patent Document 1"). Non-Patent Document 1 reports that the resistance of the channel layer is lowered by application of a positive voltage, and is increased by application of a negative voltage. Using the fact that first-order transitions are possible in a single-crystal thin film on a (110) plane oriented substrate (see Japanese Patent Application Laid-open No. 2005-213078, also referred to herein as "Patent Document 4"), a pn junction has also been reported which uses a thin film of $Nd_{0.5}Sr_{0.5}MnO_3$, which is a strongly correlated oxide thin film exhibiting metal-insulator transitions, as the p layer, and Nb-doped $SrTiO_3$ (110) substrate as the n layer. See J. Matsuno et al., "Magnetic field tuning of interface electronic properties in manganite-titanate junctions", Applied Physics Letters, vol. 92, 122104 (2008) (also referred to herein as "Non-Patent Document 2"). And recently, research has been reported on a three-terminal element using an NdNiO$_3$ thin film exhibiting metal-insulator transitions as a channel layer. See S. Asanuma et al., "Tuning of the metal-insulator transition in electrolyte-gated NdNiO$_3$", Applied Physics Letters, vol. 97, 142110 (2010) (also referred to herein as "Non-Patent Document 3").

However, according to Non-Patent Document 1, the amount of change in resistance occurring over an applied voltage range of ±10 V, expressed as a ratio, is no greater than approximately threefold. Non-Patent Document 1 uses a ferroelectric as the gate insulator. Hence the lattice mismatch at the interface between the manganese oxide used in the channel layer and the ferroelectric material which is the gate insulator thereabove becomes too great, and the occurrence of defects in the interface is unavoidable. If such defects are introduced, leakage currents through the gate insulator occur and the ferroelectric properties themselves are degraded, so that there are concerns that problems will occur if the device is used over a long period of time. Above all, the nonvolatility occurring in Non-Patent Document 1 utilizes the ferroelectric properties of the gate insulator. That is, the ferroelectric gate insulator is essential to realize nonvolatility. Further, in the pn junction described in Non-Patent Document 2 also, the giant changes in current density or capacitance expected from resistance changes of five or more orders of magnitude due to metal-insulator transitions in Nd$_{0.5}$Sr$_{0.5}$MnO$_3$ thin film and similar have not been observed, and nonvolatility is not reported. And, in the report of Non-Patent Document 3 also, although the metal-insulator transition temperature was lowered approximately 40 K by application of a −2.5 V gate voltage to a sample of channel layer thickness 5 nm, complete transition to a metallic phase due to the gate voltage did not occur, and nonvolatility is not reported. Thus in disclosures and reports to date, nonvolatile memory functions utilizing giant resistance changes have not been attained in electric field elements and other circuit components or elements using strongly correlated oxides in channel layers.

In addition, there are no known methods for using a two-phase coexistence state of a metallic phase and an insulator phase and the accompanying percolation in the operation of an element using a strongly correlated oxide in a channel layer, or in the operation of nonvolatile memory.

SUMMARY OF THE INVENTION

This invention was devised in order to resolve at least one of the above-described problems. This invention contributes to the realization of strongly correlated nonvolatile memory exhibiting nonvolatile memory functions, using giant resistance change (switching) by electrical means.

As a result of examination of the above problems, the inventor of this application concluded that it is possible to induce nonvolatile memory functions by means of the properties of the channel layer itself, and succeeded in creating a novel nonvolatile memory element not found in the prior art. Throughout this application, in order to identify the structure of a nonvolatile memory element, in some cases terms normally used for the structure of well-known field effect transistors (FETs) and thin film transistors (TFTs) are used with the object of aiding understanding.

In one mode of this invention based on a new operation principle proposed in this invention, a strongly correlated nonvolatile memory element is provided, which includes on a substrate: a channel layer including a strongly correlated oxide thin film; a gate electrode; a gate insulator formed in contact with at least a portion of a surface or interface of the channel layer and sandwiched between the channel layer and the gate electrode; and a source electrode and a drain electrode formed in contact with at least a portion of the channel layer, wherein the channel layer includes a perovskite type manganite which can undergo transitions between a metallic phase and an insulator phase, which is either a charge-ordered phase or an orbital-ordered phase.

In one mode of this invention, by means of the above configuration a strongly correlated nonvolatile memory element is provided which utilizes a bistable region and insulator-metallic transitions due to an external field exhibited by perovskite manganite, which exhibits a charge-ordered phase or an orbital-ordered phase. Below, a channel layer including a strongly correlated oxide thin film is called, as necessary, a "strongly correlated channel layer". Further, a strongly correlated nonvolatile memory element is an element utilizing a strongly correlated oxide which exhibits nonvolatile memory functions.

Further, in the strongly correlated nonvolatile memory element of one mode of this invention, the channel layer, gate insulator, and gate electrode are formed, in this order, on top of the substrate. Further, in the strongly correlated nonvolatile memory element of one mode of this invention, the gate electrode, gate insulator, and channel layer are formed, in this order, on top of the substrate.

In these modes, strongly correlated nonvolatile memory elements are provided with a so-called top-gate configuration and a bottom-gate configuration.

Further, in the strongly correlated nonvolatile memory element of one mode of this invention, the channel layer is formed of a trigger layer of a first type strongly correlated oxide and a tuning layer of a second type strongly correlated oxide, and the trigger layer and the tuning layer are disposed stacked one on the other.

Further, in the strongly correlated nonvolatile memory element of one mode of this invention, the trigger layer is sandwiched between the gate insulator and the tuning layer.

The operation principle of a three-terminal element including a strongly correlated nonvolatile memory element includes the above-described first operation principle of inducing a phase transition by using an electric field to dope the channel layer interior with carriers. Hence by making the channel layer thin and increasing the carrier density, phase transitions are facilitated. Here, through the action of the applied gate voltage, carriers accumulate on the gate insulator side. Consequently in a mode of the invention in which a trigger layer and a tuning layer are used, by deciding the thicknesses of each layer appropriately, carrier doping of the trigger layer by the gate electrode acts more effectively, and the voltage threshold can be lowered.

That is, to identify these film thicknesses specifically through their relationship with critical film thicknesses, in the strongly correlated nonvolatile memory element of one mode of the invention, it is preferable that the thickness t of the channel layer, thickness t1 of the trigger layer and thickness t2 of the tuning layer satisfy the following relations with the critical film thicknesses t1c and t2c of the trigger layer and tuning layer respectively for a metallic phase:

$$t=t1+t2 \geq \max(t1c, t2c)$$

where t1<t1c, t2<t2c, and max( ) is a function which returns the maximum value for the group of variables.

Further, in the strongly correlated nonvolatile memory element of one mode of the invention, the substrate has a (110) plane orientation or a (210) plane orientation.

By means of this mode, first-order transitions between the charge-ordered phase and the orbital-ordered phase of perovskite manganite are possible even in a single-crystal thin film, so that a channel layer with few lattice defects and similar can be used, and a giant resistance change in switching is obtained.

Further, in a strongly correlated nonvolatile memory element of this invention, after a SET operation, in which a voltage of a first polarity exhibiting an absolute value which is equal to or greater than a threshold voltage is applied to the gate electrode and a resistance value of the channel layer is lowered, with a source-drain current between the source electrode and the drain maintained at a threshold current or higher, the voltage on the gate electrode, while retaining the first polarity, is controlled such that an absolute value thereof is lowered below the threshold voltage, or, the application of the voltage is halted, whereby a resistance value of the channel layer becomes a value lower than a value prior to the SET operation.

By means of this mode, a nonvolatile memory function can be realized in which the resistance value of the channel layer is controlled by a SET operation.

Further, in a strongly correlated nonvolatile memory element of this invention, after a RESET operation, in which a voltage of a second polarity exhibiting an absolute value which is equal to or greater than a threshold voltage is applied to the gate electrode and a resistance value of the channel layer is raised, the voltage on the gate electrode, while retaining the second polarity, is controlled such that an absolute value thereof is lowered below the threshold voltage, or, the application of the voltage is halted, whereby a resistance value of the channel layer becomes a value higher than a value prior to the RESET operation.

By means of this mode, a RESET operation is possible by electrical means, without performing heating to or above the ordering temperature or similar. Further, by means of the RESET operation, a nonvolatile memory function to control the resistance value of the channel layer can be realized.

Further, in a strongly correlated nonvolatile memory element of this invention, by adjusting the value of the source-drain current in the range equal to or greater than the threshold current after the SET operation, the resistance value of the channel layer after the absolute value of the voltage applied to the gate electrode has been lowered to below the threshold voltage or voltage application has been halted is controlled at three or more values.

Further, in the RESET operation, by adjusting the value of the voltage applied to the gate electrode during the RESET operation in the voltage range such that the absolute value is equal to or greater than the threshold voltage, the value of the channel layer after the absolute value of the voltage applied to the gate electrode has been lowered to below the threshold voltage or voltage application has been halted is controlled at three or more values.

By means of these modes of the invention, a nonvolatile memory element which performs multivalued memory operations can be realized.

In any one of the modes of the invention, a strongly correlated nonvolatile memory element is realized in which the gate insulator need not secure nonvolatility because nonvolatility inherent in the channel layer appears. Further, by utilizing changes in resistance due to changes in paths resulting from percolation in the tuning layer, a strongly correlated nonvolatile memory element which can perform multivalued nonvolatile memory operations is realized.

BRIEF DESCRIPTION OF THE DRAWINGS

FIGS. 4(a) and 4(b) are explanatory diagrams explaining an operation mechanism in a channel layer in an embodiment of the invention, in which FIG. 4(a) is a typical magnetic field-temperature electronic phase diagram for perovskite manganite exhibiting a charge- and orbital-ordered phase, and FIG. 4(b) is an explanatory diagram explaining carrier doping operation in perovskite manganite using a phase diagram of temperature and hole content;

FIGS. 5(a)-5(e) are explanatory diagrams explaining the role played by the source-drain current in particular, in relation to memory operations realized by electrical means in one mode of the invention, showing operations in which FIG. 5(a): $V_g$>Vth, $I_{s-d}$<Ith, FIG. 5(b): $V_g$>Vth, $I_{s-d}$>Ith, FIG. 5(c): $V_g$<Vth, $I_{s-d}$>Ith, FIG. 5(d): $V_g$<Vth, $I_{s-d}$<Ith, and FIG. 5(e): $V_g$=0, $I_{s-d}$=0;

FIGS. 6(a) and 6(b) are timing charts showing a SET operation in time series in one mode of the invention, showing the time-series changes in the gate voltage $V_g$, source-drain current $I_{s-d}$ and source-drain resistance $R_{SD}$, in which FIG. 6(a) is normal switching operation, and FIG. 6(b) is a SET operation;

FIGS. 7(a)-7(c) are explanatory diagrams explaining conduction states in strongly correlated channel layer 2 with a two-layer structure at each temperature, in an embodiment of the invention;

DETAILED DESCRIPTION

Figure 1:
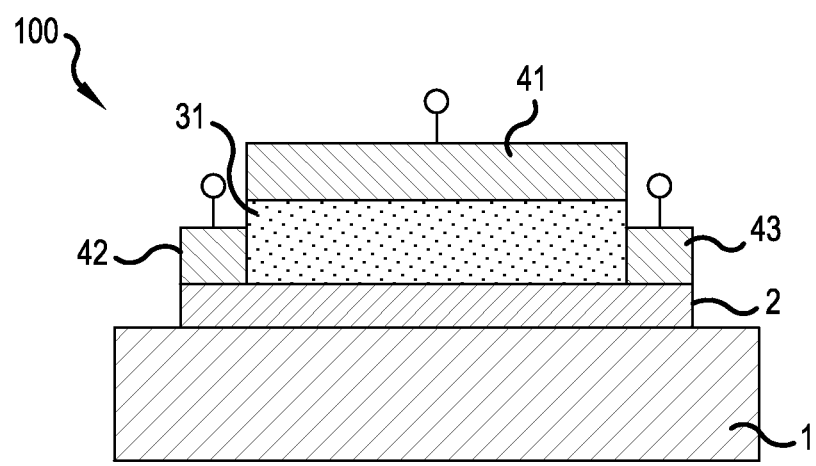
FIG. 1 is a summary cross-sectional view of one example of a top-gate type strongly correlated nonvolatile memory element in an embodiment of the invention.

Below, embodiments of strongly correlated nonvolatile memory elements of the invention are explained based on the drawings. In the explanations, unless otherwise stated, common reference symbols are assigned to common portions or elements throughout the drawings. In the drawings, elements in each embodiment are not necessarily shown to scale.

First Embodiment

1. Operation Principles

[1-1. Summary Configuration of Memory Element]

FIG. 1 is a summary cross-sectional view showing the configuration of a strongly correlated nonvolatile memory element in one example of this embodiment, and shows the structure of a strongly correlated nonvolatile memory element 100 (hereafter called "strongly correlated nonvolatile memory 100") having a top-gate structure. In FIG. 1, a channel layer 2 including a strongly correlated oxide is formed on the surface of the substrate 1 in the upward direction in the plane of the paper. Throughout this application, other terms including "top-gate structure" and "channel layer" are used to facilitate understanding of the invention of the application by contrast with for example MOSFETs (Metal Oxide Semiconductor Field Effect Transistors) using silicon, which are representative of field-effect elements of the prior art.

[1-2. Switching Mechanism]

The inventor of this application focused on the fact that in an element having the structure exemplified by the strongly correlated nonvolatile memory 100, by using in the channel layer 2 a strongly correlated oxide which exhibits a charge-ordered phase, an orbital-ordered phase, or a charge- and orbital-ordered phase in which both obtain simultaneously, switching could be performed by two types of physical mechanism. The first physical mechanism for switching is an insulator-metal transition which can be made to occur in a strongly correlated oxide by a magnetic field, electric field, electric current, optical irradiation, or other perturbing external field, as described in BACKGROUND ART. In the second physical mechanism, an electric field is made to act in a channel layer including a strongly correlated oxide, causing carrier doping, and through the action of the carriers, a phase transition in the strongly correlated oxide is induced.

Switching operation of a strongly correlated oxide thin film used as a channel layer in this embodiment is explained based on FIGS. 4(*a*) and 4(*b*). Assuming a configuration similar to a field effect element such as the strongly correlated nonvolatile memory 100, the switching and nonvolatile memory function mechanisms realized in the strongly correlated oxide used in the channel layer are explained.

[1-2-1. Bistability Mechanism and Phase Transitions]

In order to explain the first physical mechanism, FIG. 4(*a*) shows a typical magnetic field-temperature electronic phase diagram (temperature-magnetic field phase diagram) for perovskite manganites, which exhibits a charge- and orbital-ordered phase. The region 402 seen on the low-magnetic field side represents the region of an insulator phase which occurs due to charge and orbital ordering in the strongly correlated oxide. On the other hand, the region 404 seen on the high-magnetic field side represents the region of a metallic phase. The region 406 indicated by shading sandwiched between these represents a region which is in a bistable state between the insulator phase and the metallic phase, due to charge and orbital ordering in the strongly correlated oxide. That is, the strongly correlated oxide in the region 406 enters the insulator phase or the metallic phase according to the history of magnetic field application. More specifically, when a magnetic field is applied with the temperature fixed at a temperature T, starting from the region 402 and passing through the boundary BL, the region 406 indicated by shading is reached. At this time, the strongly correlated oxide is in an insulating state, that is, an insulator phase, due to a charge- and orbital-ordered phase. Then, when the magnetic field is increased, the boundary BH on the high-magnetic field side of the region 406 is reached, and the metallic phase of the region 404 results. When passing through this boundary BH, the strongly correlated oxide is observed to undergo a giant resistance change accompanying switching from the insulator phase to the metallic phase. In contrast, when the magnetic field is decreased at the same temperature, the metallic phase of the strongly correlated oxide is maintained in the regions 404 and 406. When a certain magnetic field is reached, which is the boundary BL on the low-magnetic field side, the metallic phase which had been present in the strongly correlated oxide fades away. The appearance of the above-described bistable state is brought about by a magnetic field, as one example of the first physical mechanism. Nonvolatility is obtained by means of this bistable state. In the temperature-magnetic field phase diagram of FIG. 4(*a*), the low-magnetic field side boundary BL reaches the temperature axis, indicating zero magnetic field. This indicates that at temperatures below this temperature, once the strongly correlated oxide switches to the metallic phase, thereafter the metallic phase is maintained even if the magnetic field is removed, and the insulator phase does not appear.

Next, the second physical mechanism for switching is explained. FIG. 4(*b*) is an explanatory diagram explaining carrier doping operation in perovskite manganites using a phase diagram for temperature and hole content. Shown in the diagram are two ordered phases indicating a bistable state of the strongly correlated oxide, that is, a phase diagram of an insulator phase and a metallic phase; the horizontal axis represents the hole content, and the vertical axis represents the temperature (absolute temperature). It should be noted that the phase boundary BD1 between the insulator phase I and the metallic phase M is a so-called bicritical state in which there is contention by two orders. In a strongly correlated oxide exhibiting such a phase diagram, by injecting carriers by means of an electric field which straddles the boundary between the insulator phase I and the metallic phase M, switching is realized. In particular, the white circle 412 and black circle 414 shown in FIG. 4(*b*) indicate the states of switching from the insulator phase I of the strongly correlated oxide channel layer indicated by the white circle 412, to the metallic phase M indicated by the black circle 414. This switching is induced as a result of a reduction in the hole quantity due to injection of carriers (in this case electrons) by the electric field effect. The carrier injection is performed by using an electrode (the gate electrode) to form an electric field in the channel layer, to control the voltage (gate voltage) at the gate electrode. If this application of a gate voltage is halted, the quantity of holes therewithin is reduced, and the strongly correlated oxide of the channel layer returns to the insulator phase I indicated by the white circle 412. Hence nonvolatility cannot be obtained by this second physical mechanism alone.

[1-2-2. Memory Operations by Electrical Means]

Figure 4A:
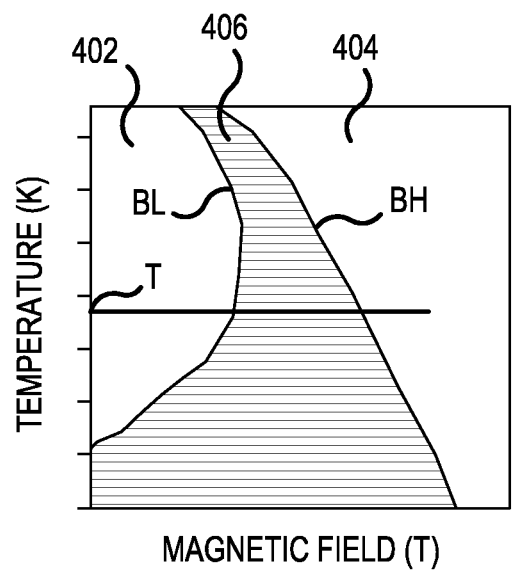
Figure 4B:
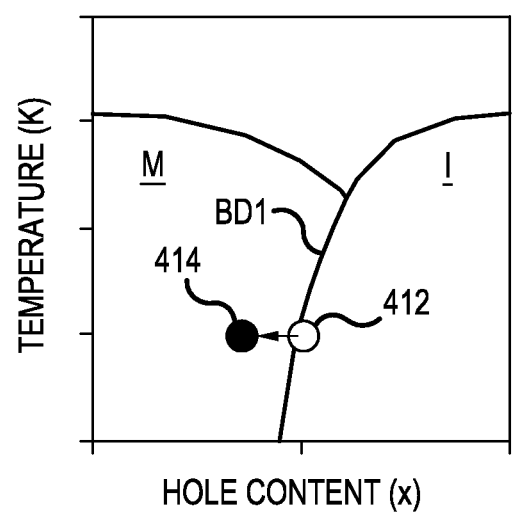

The inventor of this application realized that, by combining the two physical mechanisms for switching shown in FIG. 4(a) and FIG. 4(b), operation of nonvolatile memory would be possible. That is, in FIG. 4(b) it is seen that in addition to the temperature and hole content, an axis for an external field corresponding to the horizontal axis for the magnetic field in FIG. 4(a) is introduced. The hole content is a parameter controlling the above-described second physical mechanism, and the external field is a parameter controlling the first physical mechanism. As the external field, a magnetic field as shown in FIG. 4(a) may be used, but keeping in mind control by electrical means of a memory element taking the form of a three-terminal element as exemplified by the strongly correlated nonvolatile memory 100, here a current flowing directly through the strongly correlated oxide is used. This current is hereafter called a "source-drain current".

FIG. 5 is an explanatory diagram explaining the role played by the source-drain current in particular, in relation to memory operations realized by electrical means by combining the two physical mechanisms shown in FIGS. 4(a) and 4(b). FIGS. 5(a)-5(e) show phase transitions in the channel layer 2 in a SET operation, with temperature, hole content, and current plotted along axes, and in particular showing phase transitions between the insulator phase and metallic phase and the bistable state due to these phases. FIG. 5(a) to FIG. 5(e) show operations in which FIG. 5(a): the gate voltage $V_g$>a threshold voltage Vth, and the source-drain current $I_{s-d}$<a threshold current Ith, FIG. 5(b): $V_g$>Vth, $I_{s-d}$>Ith, FIG. 5(c): $V_g$<Vth, $I_{s-d}$>Ith, FIG. 5(d): $V_g$<Vth, $I_{s-d}$<Ith, and FIG. 5(e): $V_g$=0, $I_{s-d}$=0. Hence FIG. 5(a) is the same graph as FIG. 4(b), and FIG. 5(b) to FIG. 5(d) are phase diagrams for the strongly correlated oxide in states in which a source-drain current is flowing, while FIG. 5(e) is a phase diagram showing the strongly correlated oxide after switching and halting the source-drain current. In FIG. 5(b) to FIG. 5(d), the metallic phase region is shown in a position corresponding to the value of the source-drain current. Here, cases are explained in which the doped carriers are electrons because the gate voltage $V_g$ is of positive polarity.

Figure 5A:
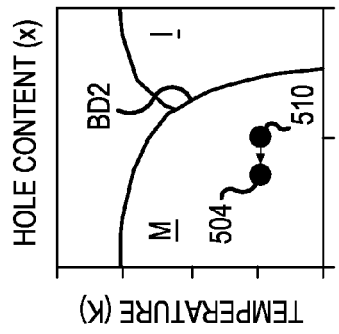
Figure 5B:
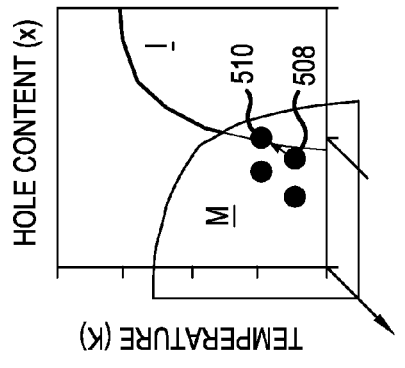
Figure 5C:
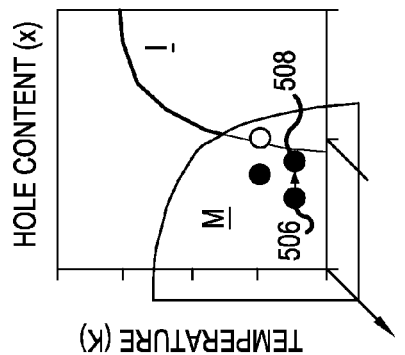
Figure 5D:
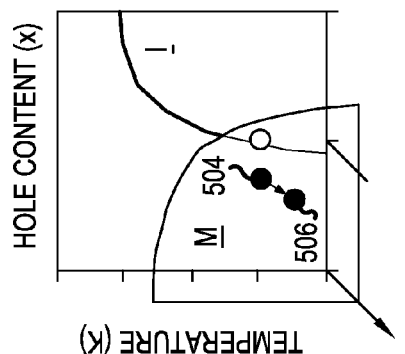

First, carriers (in this case electrons) are injected by means of the gate voltage, to perform switching from the insulator phase indicated by the white circle 502 to the metallic phase indicated by the black circle 504 to enter the state of FIG. 4(b) (FIG. 5(a)). Then, suppose that by increasing the source-drain voltage, so that the current exceeds a certain value (the current threshold), the bistable region (region 406) indicated by shading in FIG. 4(a) is entered. The change in the strongly correlated oxide to this state in which a source-drain current is flowing is represented by the arrow from the black circle 504 to the black circle 506. As indicated by this arrow, the source-drain current is adjusted independently of the hole content. In FIG. 5, changes in the source-drain current are shown explicitly by adding a current axis. Next, even when gate voltage application is halted while maintaining the current, and the hole content is adjusted to be the same as for the white circle 502, the metallic state is maintained, as indicated by the black circle 508 in FIG. 5(c). This is because the strongly correlated oxide in the state in which a source-drain current is flowing is in a bistable state similar to that of region 406 in FIG. 4(a). Thereafter, even if the current supply is halted and the state returns in the current axis direction from the black circle 508, the metallic state is maintained, as indicated by the black circle 510 in FIG. 5(d).

Figure 5E:
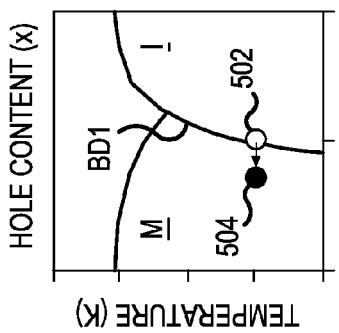

That is, when the carrier doping quantity (hole quantity) is simply adjusted through the gate voltage, only switching between the insulator phase and the metallic phase is obtained, but by applying an external field at or above a threshold in the metallic phase, control of a bistable state which depends on the material history becomes possible. The threshold of the current corresponds to the boundary BH in FIG. 4(a) when the external field is a magnetic field. Hence after passing through the history from FIG. 5(a) to FIG. 5(b) to FIG. 5(d), even when the gate voltage and the supply of source-drain current are both halted, the strongly correlated oxide is maintained in the metallic phase, as shown in FIG. 5(e). By means of this mechanism, nonvolatile memory functions are realized in a memory element which adopts a strongly correlated oxide in the channel layer. In order to realize this operation by electrical means, the strongly correlated oxide nonvolatile memory element of one mode of the invention of this application adopts a configuration similar to the above-described three-terminal field effect element.

Relating to FIGS. 5(a)-5(e), the above-described operation example can be associated with an operation to lower the electrical resistance of the channel layer, that is, a SET operation. In this association, in a strongly correlated oxide nonvolatile memory element which is one mode of the invention of this application, nonvolatile memory functions can be realized even in an operation to increase the resistance of the channel layer and then return to the original value, that is, a RESET operation. Specifically, in a RESET operation, the gate voltage is made a voltage of polarity opposite that of the voltage used in a SET operation, and then, by applying the gate voltage, the phase boundary BD2 (FIG. 5(e)) is passed, and switching to the insulator phase I occurs (not shown). Thereafter, when application of the gate voltage is halted in order to enter a state in which current supply has been halted, and more generally a state in which a current below the above-described current threshold is flowing, the strongly correlated oxide is maintained in the insulating state. That is, the resistance of the channel layer is maintained in a high-resistance state. This RESET operation uses the bistability of the strongly correlated oxide, and corresponds to transitioning from a state of the phase diagram shown in FIG. 5(e) to a state of the phase diagram shown in FIG. 5(a) by changing the carrier content (changing only the horizontal axis in the diagrams). It should be noted that between FIG. 5(a) and FIG. 5(e), the boundary BD1 and boundary BD2 are shifted.

The asymmetry between the above-described SET operation and RESET operation arises from the fact that the initial state is an insulator phase.

Next, based on the timing chart of FIGS. 6(a) and 6(b), the SET operation shown in FIGS. 5(a)-5(e) is explained from the standpoints of changes with time in the gate voltage $V_g$, source-drain current, and source-drain resistance. First, operation is explained for a case in which SET operation is not performed. FIG. 6(a) is a timing chart for a case of an operation under conditions such that the source-drain current $I_{s-d}$ is less than the current threshold Ith for SET operation. In this case, as shown in FIG. 4(b), carriers are injected by applying the gate voltage $V_g$ and switching from the insulator phase to the metallic phase occurs. Accompanying this, the source-drain resistance $R_{s-d}$, that is, the resistance of the channel layer strongly correlated oxide, assumes a low resistance value $R_L$. This switching is a phenomenon which occurs because the gate voltage $V_g$ passes through the phase boundary BD1 (FIG. 4(b)), and so is equal to or greater than the required voltage threshold Vth. However, when the gate voltage $V_g$ is lowered below the voltage threshold Vth and returned to the original value, the source-drain resistance $R_{s-d}$ again assumes a high resistance value $R_H$. This is because conditions were used under which $I_{s-d}$ was lower than the current threshold Ith for SET operation.

On the other hand, if, with the source-drain current $I_{s-d}$ at a value exceeding the current threshold Ith for SET operation, the gate voltage $V_g$ is similarly changed, a SET operation is realized. FIG. 6(b) is a timing chart showing this operation. As shown in FIG. 6(b), in this operation the gate voltage $V_g$ is changed to Vth or higher while making the source-drain current $I_{s-d}$ equal to or greater than a certain current threshold Ith. Thereafter, even if the gate voltage $V_g$ is lowered to Vth or below, the source-drain resistance $R_{s-d}$ is maintained at the low resistance value $R_L$. After halting application of the gate voltage $V_g$, even if the source-drain current $I_{s-d}$ is made equal to or less than the current threshold Ith, the source-drain resistance $R_{s-d}$ continues to be the low resistance value $R_L$. In this way, by passing a source-drain current $I_{s-d}$ exceeding the current threshold Ith through the channel layer to perform a SET operation, a SET state can be realized.

[1-3. Channel Layer with Two-Layer Structure]

Figure 3:
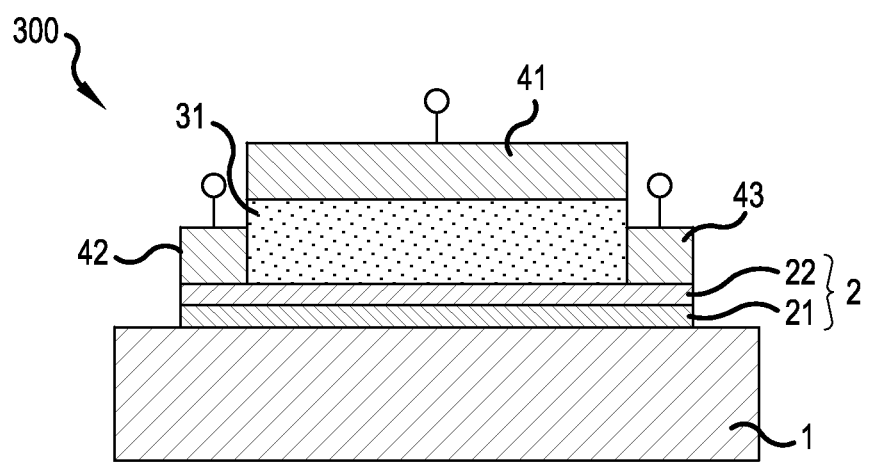
FIG. 3 is a summary cross-sectional view of one example of a strongly correlated nonvolatile memory element having a strongly correlated channel layer comprising a trigger layer and a tuning layer, in an embodiment of the invention.

Next, transition phenomena in strongly correlated oxides when a stacked structure of a trigger layer and a tuning layer is adopted in the channel layer 2 are explained. FIG. 3 is a summary cross-sectional view showing the configuration of a strongly correlated nonvolatile memory element in one example of this embodiment, and shows the structure of a top-gate structure strongly correlated nonvolatile memory element 300 (hereafter called "strongly correlated nonvolatile memory 300") having a channel layer 2 comprising the two layers of a strongly correlated oxide tuning layer 21 (hereafter called the "tuning layer 21") and a strongly correlated oxide trigger layer 22 ("trigger layer 22"). In general in a strongly correlated oxide thin film, in order to stabilize the metallic phase or realize a metal-insulator transition, the thin film must be fabricated to a certain thickness. This is because if the thickness of the strongly correlated oxide thin film is too thin, a stabilized metallic phase and metal-insulator transitions are not realized. That is, a metal phase is realized, and metal-insulator transitions are realized, only in a strongly correlated thin film formed to a thickness greater than a critical value for the thickness (hereafter called the "critical thickness"). In this sense, the critical thickness may be called the lower limit for the film thickness necessary for the stable existence of the metallic phase, or necessary for exhibiting metal-insulator transitions. Because of this phenomenon peculiar to strongly correlated oxides, there are cases in which if the channel layer 2 is made thin in order to raise the carrier density, the metallic phase and metal-insulator transitions themselves may disappear.

In order to overcome these general properties, as a preferred configuration of this embodiment, the inventor of this application created a stacked structure for the strongly correlated channel layer 2 in which the trigger layer 22 and the tuning layer 21 have different roles. FIGS. 7(a)-7(c) are explanatory diagrams explaining the conduction state in the strongly correlated channel layer 2 with this two-layer structure at different temperatures. As a preferred configuration, the specifics of appropriately setting the thicknesses of each layer in particular are explained. Here, a channel layer including two layers is considered in which the thickness t1 of the strongly correlated oxide trigger layer 22 is made thinner than the critical thickness t1c, and the thickness t2 of the tuning layer 21 is made thinner than the critical thickness t2c. Because the trigger layer 22 and the tuning layer 21 as single layers are thinner than the respective critical thicknesses t1c and t2c, metal-insulator transitions and the metallic phase vanish. The inventor of this application focused on the fact that the mechanism of this vanishing is the two-dimensional nature of the electronic states when the layers are thin. Here, suppose that the thickness t of the entire channel layer including the above-described two layers is decided so as to satisfy t=t1+t2max(t1c, t2c). Here max(t1c, t2c) is a function which returns the greatest value among t1c and t2c which are the variables of the function max( ). In a case where this condition for the thickness is satisfied, consider an instance in which the trigger layer 22 exhibits the metallic phase. At this time, in the channel layer as a whole the electronic state is three-dimensional. Consequently, metal-insulator transitions and the metallic phase are maintained in the channel layer 2 overall. Next, a case is considered in which the trigger layer 22 enters the insulator phase through a metal-insulator transition. At this time, because the trigger layer 22 is in the insulator phase, carriers within the tuning layer 21 which is disposed in contact with the trigger layer 22 feel only the thickness t2 of the strongly correlated oxide tuning layer 21, rather than the thickness of the entire channel layer 2. The thickness t2 of the tuning layer 21 is thinner than the critical thickness t2c for the metallic phase, and so the metallic phase in the tuning layer 21 vanishes, and as a result the resistance value of the channel layer 2 overall increases. In this way, when the above thickness conditions are satisfied, the resistance of the channel layer overall is dominated by the metal-insulator transition in the trigger layer 22. That is, if the trigger layer 22 is in the metallic phase the channel layer 2 is in the metallic phase with a low resistance value, and if the trigger layer 22 is in the insulator phase the channel layer 2 is in the insulator phase with a high resistance value.

The mechanisms in the case in which the strongly correlated channel layer 2 includes the above two layers can be explained using the model shown in FIGS. 7(a)-7(c). The diagrams in FIGS. 7(a)-7(c) are in order, from FIG. 7(a), explanatory diagrams schematically illustrating the movement of conduction carriers within the channel layer 2, in comparison with an orbital ordering temperature $T_{oo}$, when the temperature T is higher than $T_{oo}$ (FIG. 7(a)), is approximately equal to $T_{oo}$ (FIG. 7(b)), and is lower than $T_{oo}$ (FIG. 7(c)). Suppose that for example at room temperature (300 K) and similar, there is cooling from the high-temperature state shown in FIG. 7(a). In the channel layer 2, in the temperature region near or below the Curie temperature $T_c$=200 K, the sign of the differential temperature coefficient of resistivity is positive. Here, typically carriers propagate over the entire channel layer 2, that is, spanning the tuning layer 21 and the trigger layer 22, as indicated by the arrow in FIG. 7(a). That is, the total thickness t of the channel layer 2 including the above two layers satisfies t=t1+t2≥max(t1c, t2c). Consequently carriers propagate over the entire channel layer 2 and the electronic state extends over a three-dimensional region. In this way, when the strongly correlated oxide trigger layer exhibits the metallic phase, the metallic phase is maintained. Upon further cooling so that the temperature T is approximately at $T_{oo}$, for example near 100 K, the trigger layer 22 undergoes a phase transition to the insulator phase by means of a metal-inductor transition (FIG. 7(b)). At this time, conduction carriers within the tuning layer 21 disposed in contact with the trigger layer 22 "feel" only the thickness t2 of the tuning layer 21. That is, the state of the conduction carriers is affected by the reduction in thickness of the region in which the conduction carriers themselves can propagate. For the conduction carriers, the thickness is not the thickness t of the entire channel layer 2, but only the thickness t2 of the tuning layer 21.

FIG. 7(b) shows the manner of conduction by conduction carriers in the tuning layer 21 alone in this state. That is, conduction carriers in the trigger layer 22 are localized as indicated by the dotted pattern in the diagram, whereas conduction carriers in the tuning layer 21 behave as if the thickness of the channel layer 2 is for example one-half as great. Thus for the conduction carriers in the channel layer 2, the thickness which is "felt" has switched from the thickness of the entire channel layer 2 to the thickness of only the tuning layer 21. When further cooling occurs and the temperature falls below $T_{oo}$, the metallic phase in the tuning layer 21 vanishes, and as a result the resistance value of the entire channel layer 2 increases. FIG. 7(c) shows the manner in which, in this state, conduction carriers are localized in both of the layers. That is, when the temperature falls below $T_{oo}$, carriers in the tuning layer 21 are also localized. The adoption of a trigger layer 22 and tuning layer 21 can be described as an approach in which phenomena which change the electrical resistance are actively utilized by changing the dimensionality, so to speak, of the conduction carriers.

[1-4. Percolation]

Figure 8A:
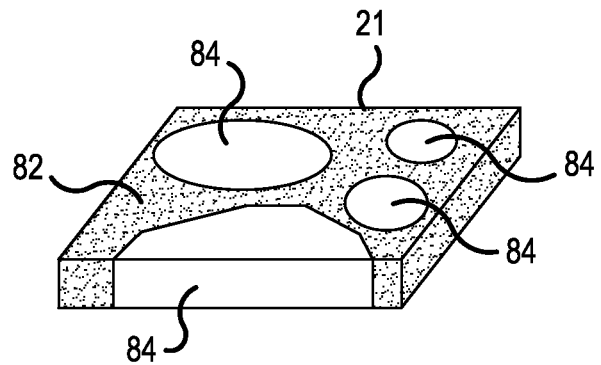
FIGS. 8(a)-8(c) are schematic diagrams showing the mechanism of resistance change in a channel layer due to the tuning layer in an embodiment of the invention, showing the manner in which the external field intensity increases in order from FIG. 8(a) to FIG. 8(c)
Figure 8B:
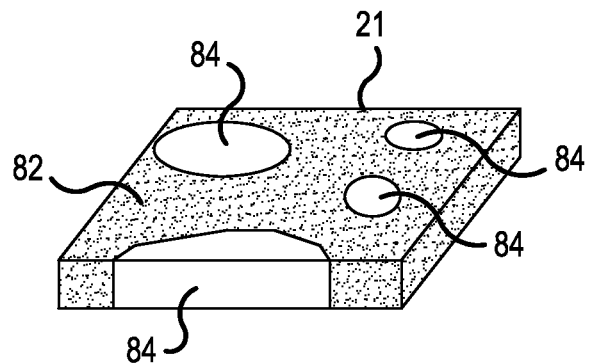
Figure 8C:
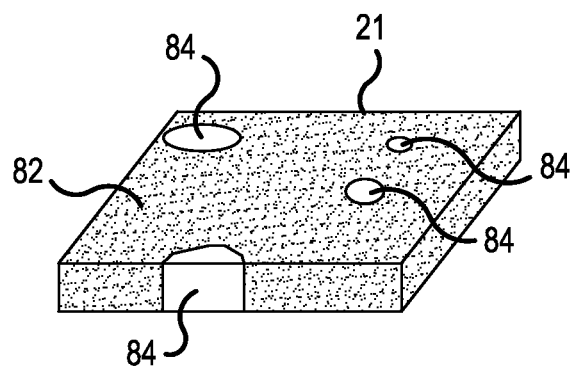

Next, percolation in the metallic phase in the tuning layer is explained based on FIGS. 8(a)-8(c). FIGS. 8(a)-8(c) are schematic diagrams showing the mechanism of resistance change of the channel layer due to the tuning layer, and shows, in order from FIG. 8(a) to FIG. 8(c), the manner of percolation in the metallic phase in the tuning layer 21 when the external field intensity is increased. In the diagrams, the regions 82 indicated by shading represent the metallic phase, and white regions 84 represent the insulator phase. In this embodiment, suppose that the thickness of the tuning layer 21 is typically several nanometers. In this case, there is no need to consider changes in the film thickness direction, and domains are thought to be uniform in the thickness direction. As indicated in FIG. 8(a), in a state in which there are large insulator phase regions, the resistance is high. Then, upon increasing the external field intensity, such as the above-described source-drain current or similar, the insulator phase regions 82 are reduced as shown in FIG. 8(b), and to this extent the proportion occupied by the metallic phase regions 84 increases. When the external field intensity is further increased, insulator phase regions 84 hardly appear at all, as shown in FIG. 8(c).

In this way, the proportion of the metallic phase relative to the insulator phase in the tuning layer 21 changes according to the external field intensity, and the extent of carrier localization also changes according to the state of percolation paths. Using this property, the value of the electrical resistance of the tuning layer 21 can be controlled to be not just the two values of low resistance and high resistance, but three or more values can be realized. In this case, the resistance value of the tuning layer 21 is determined by the geometric structure (lengths, thicknesses, number) of paths due to percolation between source and drain. Hence the resistance value of the entire channel layer 2 can also be made multivalued, taking on three or more values, according to the state of the tuning layer 21.

In this way, in a preferred form of one mode of the invention, switching operations are realized by insulator-metal transitions in the trigger layer 22. Further, by using percolation occurring in metal phase regions 82 and insulator phase regions 84 in the tuning layer 21, multivalued resistance values are possible.

2. Element Structures

Below, strongly correlated nonvolatile memory elements using a strongly correlated oxide of this embodiment are explained based on the drawings. The structures of strongly correlated nonvolatile memory elements of this embodiment are explained for two typical configurations, which are the top-gate configuration and the bottom-gate configuration. Further, preferred structures for a channel layer with two layers in a stacked structure are also explained.

[2-1. Top-Gate Structure]

Referring again to FIG. 1, the configuration of a strongly correlated nonvolatile memory element of one example of the embodiment is explained. As shown in the summary cross-sectional view, the strongly correlated nonvolatile memory 100 is fabricated with a top-gate structure. On the upper face of the channel layer 2 in FIG. 1 is formed a gate electrode 41, with a gate insulator 31 interposed. Further, a drain electrode 42 and a source electrode 43 are formed so as to be in contact with the channel layer 2. By selecting a perovskite type oxide as the material forming the substrate 1 and channel layer 2, the channel layer 2 can be grown epitaxially on the substrate 1. By this means, a high-quality thin film can be fabricated as the channel layer 2. It is preferable that the substrate 1 be of for example $(LaAlO_3)_{0.3}(SrAl_{0.5}Ta_{0.5}O_3)_{0.7}$ (hereafter abbreviated to "LSAT") or of $SrTiO_3$. By so forming the substrate 1, perovskite manganite, which can transition between a metallic phase and either among the charge-ordered phase or the orbital-ordered phase among insulator phases, can be used as the channel layer.

[2-2. Bottom-Gate Structure]

Figure 2:
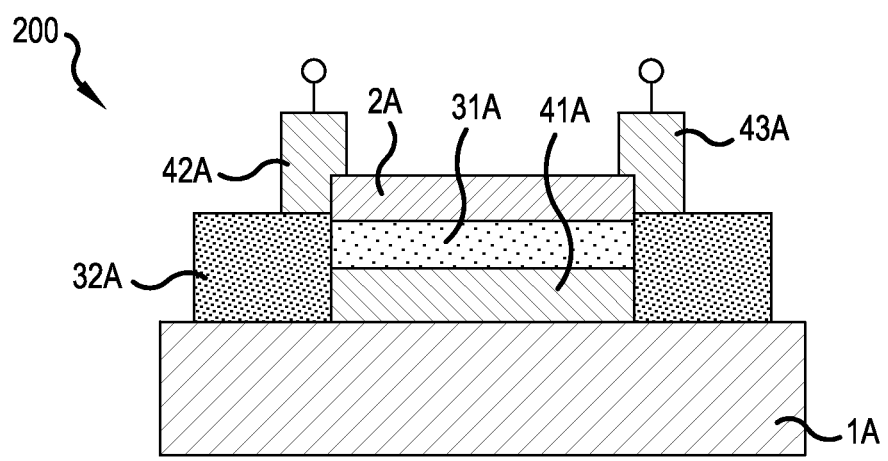
FIG. 2 is a summary cross-sectional view of one example of a bottom-gate type strongly correlated nonvolatile memory element in an embodiment of the invention.

As a modification of the strongly correlated nonvolatile memory 100 shown in FIG. 1, in this embodiment a strongly correlated nonvolatile memory element with a bottom-gate structure can also be fabricated. FIG. 2 is a summary cross-sectional view of a strongly correlated nonvolatile memory element 200 (hereafter "strongly correlated nonvolatile memory 200") with a bottom-gate structure, which is a separate example of a strongly correlated nonvolatile memory element of this embodiment. As shown in FIG. 2, in the strongly correlated nonvolatile memory 200, a gate electrode 41A is disposed on the side of the substrate 1A seen from the channel layer 2. In order to fabricate a strongly correlated nonvolatile memory 200 with this structure, first a gate electrode 41A is formed as a conductive oxide thin film, which can be grown epitaxially, on the upper face in the plane of the paper of the substrate 1A in FIG. 2. Next, a gate insulator 31A and strongly correlated oxide channel layer 2A are stacked, in this order. By using perovskite oxides for all of the substrate 1A, channel layer 2A, and the gate electrode 41A and gate insulator 31A positioned between the channel layer 2A and the substrate 1A, a high-quality thin film can be fabricated by epitaxial growth on the substrate 1A as the channel layer 2A. For example, LSAT or $SrTiO_3$ are desirable as the substrate 1A. As the gate electrode 41A, $La_{1-x}Sr_xMnO_3$ thin film (x=0.2 to 0.4), and as the gate insulator 31A a material of the same type as the substrate 1A, that is, LSAT if the substrate 1A is LSAT, and $SrTiO_3$ if the substrate 1A is $SrTiO_3$, is preferable. As the strongly correlated oxide channel layer 2A, if the substrate 1A is LSAT, then for example $Pr_{0.5}Sr_{0.5}MnO_3$ thin film is preferable, and if the substrate 1A is $SrTiO_3$, then $Nd_{0.5}Sr_{0.5}MnO_3$ thin film is preferable. Through such a configuration, the channel layer can be formed from perovskite manganite capable of phase transitions between a metallic phase and an insulator phase which is either a charge-ordered phase or an orbital-ordered phase.

In the strongly correlated nonvolatile memory 200, for example the three layers which are the gate electrode 41A, gate insulator 31A and channel layer 2A are first formed. Then, the three layers are etched together by photolithography and patterned to a shape within the face of the substrate 1A, and patterned as shown in FIG. 2. Then, after forming the insulating film 32A, the drain electrode 42A and source electrode 43A are formed on a position on the surface or an interface of the channel layer 2. In this way the structure of the strongly correlated nonvolatile memory 200 of FIG. 2 is formed.

[2-3. Two-Layer Channel Structure in a Top-Gate Structure]

Referring again to FIG. 3, the structure of a strongly correlated nonvolatile memory element 300 with a top-gate configuration is explained. On the upper face of the substrate 1 in the plane of the paper in FIG. 3 is formed the channel layer 2 comprising, in order from the side of the substrate 1, the tuning layer 21 and the trigger layer 22.

On the upper face of the channel layer 2 in FIG. 3 is formed the gate electrode 41, with the gate insulator 31 interposed. Further, the drain electrode 42 and source electrode 43 are formed so as to be in contact with the channel layer 2. FIG. 3 depicts as an example the drain electrode 42 and source electrode 43 in contact with the trigger layer 22. By selecting perovskite oxides as the materials forming the substrate 1 and the two layers (tuning layer 21 and trigger layer 22) included in the channel layer 2, the tuning layer 21 and trigger layer 22 of the channel layer 2 can be grown epitaxially on the substrate 1. By this means, a high-quality thin film can be fabricated as the channel layer 2.

Next, the tuning layer 21 in the strongly correlated nonvolatile memory 300 shown in FIG. 3 is explained. For the tuning layer 21, in addition to being a strongly correlated oxide, if the substrate 1 is of LSAT it is preferable that $Nd_{0.5}Sr_{0.5}MnO_3$ thin film be adopted, and if the substrate 1 is of $SrTiO_3$, it is preferable that $Pr_{0.5}Sr_{0.5}MnO_3$ thin film be adopted.

The trigger layer 22 is explained. For the trigger layer 22, in addition to being a strongly correlated oxide, if the substrate 1 is of LSAT it is preferable that $Pr_{0.5}Sr_{0.5}MnO_3$ thin film be adopted, and if the substrate 1 is of $SrTiO_3$, it is preferable that $Nd_{0.5}Sr_{0.5}MnO_3$ thin film be adopted. The gate insulator 31, gate electrode 41, drain electrode 42, and source electrode 43 need not be perovskite oxides, and materials which are suitable for use can be selected.

Hence examples of materials selected as the strongly correlated oxide for the trigger layer 22 (first type strongly correlated oxide) and as the strongly correlated oxide for the tuning layer 21 (second type strongly correlated oxide) to be used as the channel layer 2 are, when the substrate 1 is of LSAT, respectively $Pr_{0.5}Sr_{0.5}MnO_3$ and $Nd_{0.5}Sr_{0.5}MnO_3$. On the other hand, when the substrate 1 is of $SrTiO_3$, examples of the above materials are respectively $Nd_{0.5}Sr_{0.5}MnO_3$ and $Pr_{0.5}Sr_{0.5}MnO_3$.

3. Examples 3-1. Element Fabrication Example

Below, a method of fabrication of a strongly correlated nonvolatile memory element of this embodiment is explained. This explanation is based on a specific method used to fabricate an example of the strongly correlated nonvolatile memory 300 with a top-gate structure, having two layers which are a channel layer 2 comprising a tuning layer 21 and trigger layer 22, shown in FIG. 3. Below, the invention is explained more specifically using an example. The materials, quantities used, proportions, details of processing, processing procedures and similar in the following example can be changed appropriately so long as there is no deviation from the gist of the invention. Hence the scope of the invention is not limited to the specific example below.

Materials used in the strongly correlated nonvolatile memory element of the example of this embodiment were, as the trigger layer 22, $Pr_{0.5}Sr_{0.5}MnO_3$, and as the tuning layer 21, $Nd_{0.5}Sr_{0.5}MnO_3$; the substrate 1 was an LSAT (110) plane oriented substrate. None of the configurations of manufacturing apparatuses are shown.

First, in the example of the strongly correlated nonvolatile memory 300 of this embodiment, the channel layer 2 including strongly correlated oxides was fabricated using a laser ablation method. As the targets for each of the materials, polycrystalline materials of the compositions, formed into a disc shape of diameter 20 mm and 5 mm thick by a solid-phase reaction method, were fabricated and used. Specifically, the LSAT (110) substrate as the substrate 1 was mounted in a vacuum chamber, which was evaluated to a pressure of $3 \times 10^{-9}$ Torr ($4 \times 10^{-7}$ Pa) or lower. Then, high-purity oxygen gas was introduced to a pressure of 1 mTorr (0.133 Pa), and the substrate was heated until 900° C. was reached. Next a KrF excimer laser of wavelength 248 nm was used to irradiate targets via a port for introduction of laser light into the chamber. Next, an $Nd_{0.5}Sr_{0.5}MnO_3$ thin film was formed to a thickness of 11 atomic layers as the tuning layer 21. Then, in the same atmosphere, a $Pr_{0.5}Sr_{0.5}MnO_3$ thin film was formed to a thickness of 11 atomic layers as the strongly correlated oxide layer for the trigger layer 22. The thicknesses of one of these atomic layers corresponded to the spacing d(110) between (110) planes. That is, d(110) in $Pr_{0.5}Sr_{0.5}MnO_3$ and $Nd_{0.5}Sr_{0.5}MnO_3$ corresponds to 0.27 nm, and so the thickness of 11 atomic layers is in both cases approximately 3 nm. In other words, in the example of a strongly correlated nonvolatile memory 300 here fabricated, the strongly correlated oxide trigger layer 22 had a thickness t1 of 3 nm, the tuning layer 21 had a thickness t2 of 3 nm, and so the thickness t of the channel layer 2 was approximately 6 nm.

After forming the channel layer 2 including these two layers, an atomic layer deposition method was used to form aluminum oxide as the gate insulator 31. Then, after photolithography, etching and electrode fabrication processes, the three-terminal strongly correlated nonvolatile memory element shown in FIG. 1 was fabricated.

[3-2. Characteristics of Strongly Correlated Oxides]

[3-2-1. Characteristics when a Magnetic Field is Used as an External Field]

Figure 9:
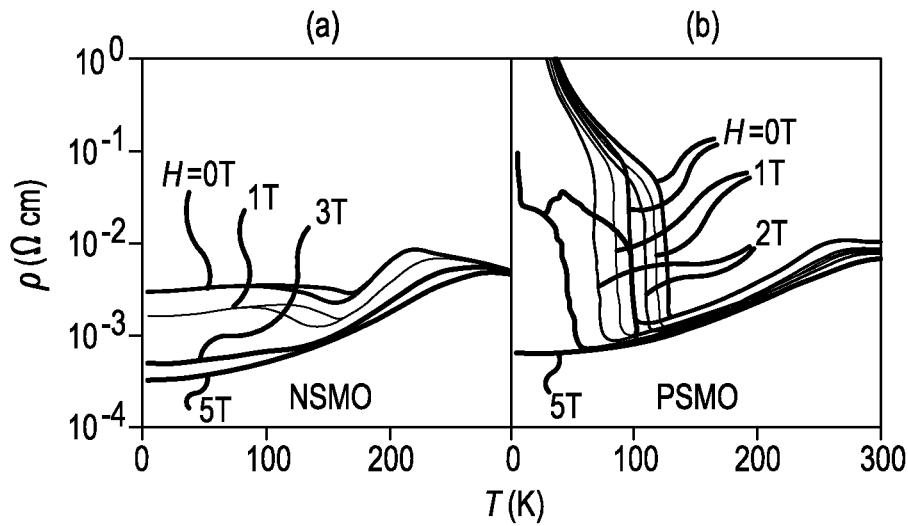
FIG. 9 is a graph showing the temperature and magnetic field dependences of the resistivity of the material of the tuning layer and trigger layer in a strongly correlated nonvolatile memory element of an embodiment of the invention, in which part (a) is for an $Nd_{0.5}Sr_{0.5}MnO_3$ thin film (film thickness 80 nm) used as a tuning layer, and part (b) is for a $Pr_{0.5}Sr_{0.5}MnO_3$ thin film (film thickness 40 nm) used as a trigger layer.

Next, more general characteristics of the $Nd_{0.5}Sr_{0.5}MnO_3$ adopted as the tuning layer 21 and the $Pr_{0.5}Sr_{0.5}MnO_3$ adopted as the trigger layer 22 in the above example are explained. FIG. 9 shows graphs of the temperature dependence of the volume resistivity $\rho$ for each material. Part (a) of FIG. 9 describes $Nd_{0.5}Sr_{0.5}MnO_3$, and FIG. 9(b) describes $Pr_{0.5}Sr_{0.5}MnO_3$. Each graph shows the external magnetic field as a parameter. As indicated in part (b) of FIG. 9, the $Pr_{0.5}Sr_{0.5}MnO_3$ thin film (thickness 40 nm) on the LSAT (110) substrate exhibits a sharp metal-insulator transition due to orbital ordering. Upon conducting separate studies, the critical thickness t1c for $Pr_{0.5}Sr_{0.5}MnO_3$ is approximately 5 nm. On the other hand, $Nd_{0.5}Sr_{0.5}MnO_3$ thin film (thickness 80 nm) on the LSAT (110) substrate exhibits a two-phase coexistence state, in which a charge- and orbital-ordered insulator phase and a metallic phase are intermixed, as indicated by the graph of FIG. 9(a). The critical thickness t2c of $Nd_{0.5}Sr_{0.5}MnO_3$ is less than approximately 5 nm. Hence the channel layer 2 in the above example satisfies the condition $t=t1+t2 \max(t1c, t2c)$, where $t1<t1c$ and $t2<t2c$.

[3-2-2. Operation as a Memory Element]

[3-2-2-1. Phase Transition in the Channel Layer Due to a Magnetic Field]

Figure 10:
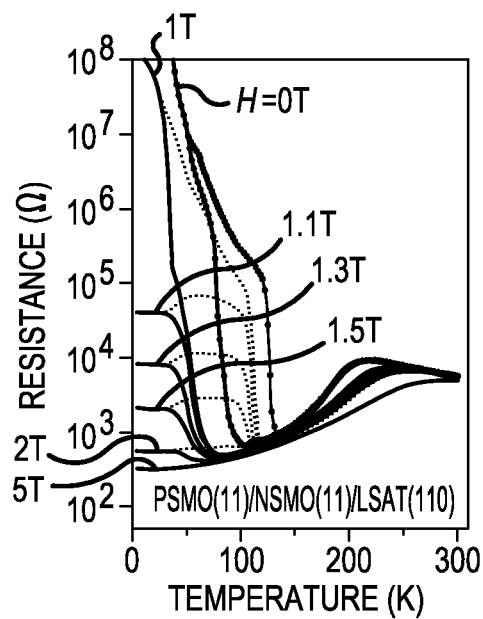
FIG. 10 is a graph of the temperature and magnetic field dependences of the resistivity of the channel layer in the strongly correlated nonvolatile memory element of an embodiment of the invention, in which the trigger layer is a 3 nm thick thin film of $Pr_{0.5}Sr_{0.5}MnO_3$, and the tuning layer is a 3 nm thick thin film of $Nd_{0.5}Sr_{0.5}MnO_3$.

Next, characteristics of the strongly correlated nonvolatile memory 300 are explained. FIG. 10 is a graph of measurements of the electrical resistance of the channel layer 2 in a strongly correlated nonvolatile memory 300 fabricated by the processes described above, while changing the temperature and magnetic field. Here the gate voltage was held at 0 V, and a magnetic field, which is an external field exerting an action similar to a gate voltage, was applied. As shown in FIG. 10, when the temperature of the strongly correlated nonvolatile memory 300 was cooled from room temperature, the electrical resistance of the channel layer 2 increased sharply at 100 K, and it was confirmed that the ratio of electrical resistances before and after the increase was as large as six orders of magnitude or greater. That is, a channel layer 2 comprising a strongly correlated oxide trigger layer 22 and a strongly correlated oxide tuning layer 21 can enter an insulating state by means of a metal-insulator transition in the strongly correlated oxide of the trigger layer 22. Thus despite the existence of the strongly correlated oxide tuning layer 21, the influence of the metal-insulator transition in the strongly correlated oxide of the trigger layer 22 causes the metallic phase in the tuning layer 21 to disappear. As a result, it was confirmed that a huge resistance change can be obtained for the channel layer 2 as a whole. Further, it was confirmed that when a magnetic field is applied and cooling is performed, the resistance value changes according to the magnetic field intensity. This indicates that the metallic phase in the tuning layer 21 increases according to increases in the magnetic field intensity, so that percolation paths appear between the electrodes. In other words, the resistance value for the channel layer 2 as a whole is switched by the trigger layer 22, and moreover, the resistance value can take on three or more values according to percolation paths in the tuning layer 21.

[3-2-2-2. Bistable Operation of the Channel Layer Due to a Magnetic Field]

Figure 11:
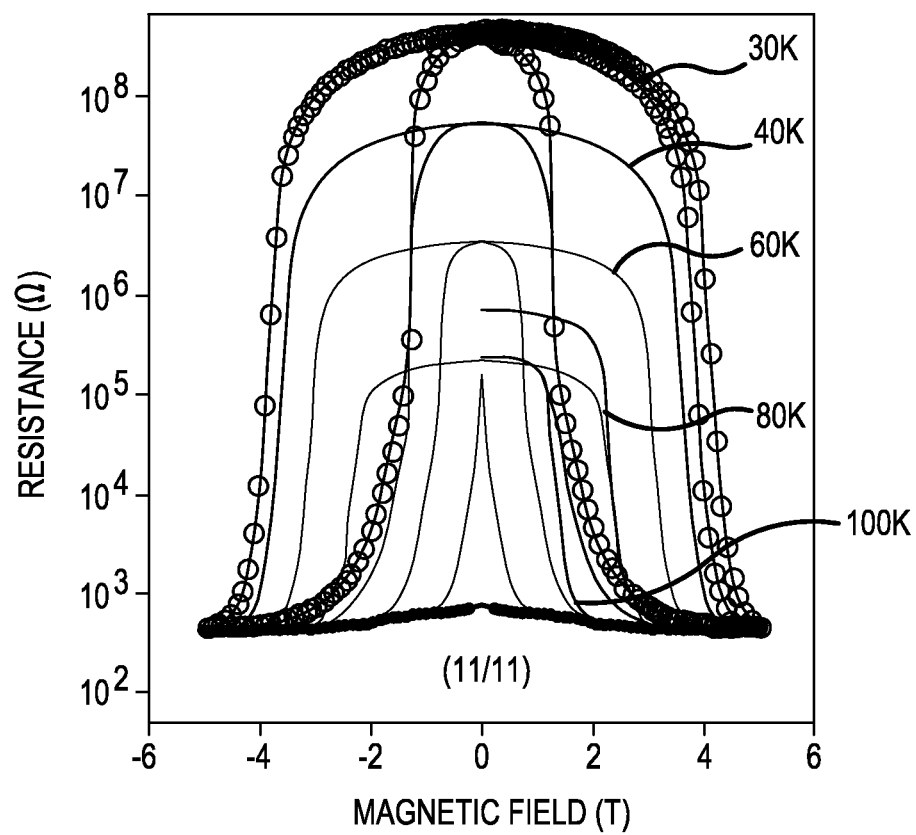
FIG. 11 is a graph of electrical resistivity in magnetic sweeping after cooling with no magnetic field of a strongly correlated nonvolatile memory element in an embodiment of the invention.

The strongly correlated nonvolatile memory 300 was further cooled to a prescribed temperature with no magnetic field present, and then a magnetic field was applied and sweeping performed, and the electrical resistance of the channel layer 2 was measured. FIG. 11 is a graph of the electrical resistance after cooling with no magnetic field of the strongly correlated nonvolatile memory 300; the curves are the results of magnetic field sweeping measured at temperatures, in order from the largest changes in resistance, of 30 K, 40 K, 60 K, 80K and 100 K, and the horizontal axis represents the sweeping magnetic field, shown in units of magnetic flux density. At each temperature, it was confirmed that a bistable state such as in the temperature-magnetic field phase diagram of FIG. 4(a) was confirmed. At 100 K in particular, the low-resistance state occurring upon application of a 5 T sweeping magnetic field, that is, the metallic phase, was substantially preserved even with no magnetic field present. Hence it may be that even at temperatures other than 100 K, if the magnetic field intensity is still greater, a metallic phase may be preserved even with no magnetic field present.

[3-2-2-3. Influence of Percolation in the Channel Layer on Electrical Resistance]

Figure 12:
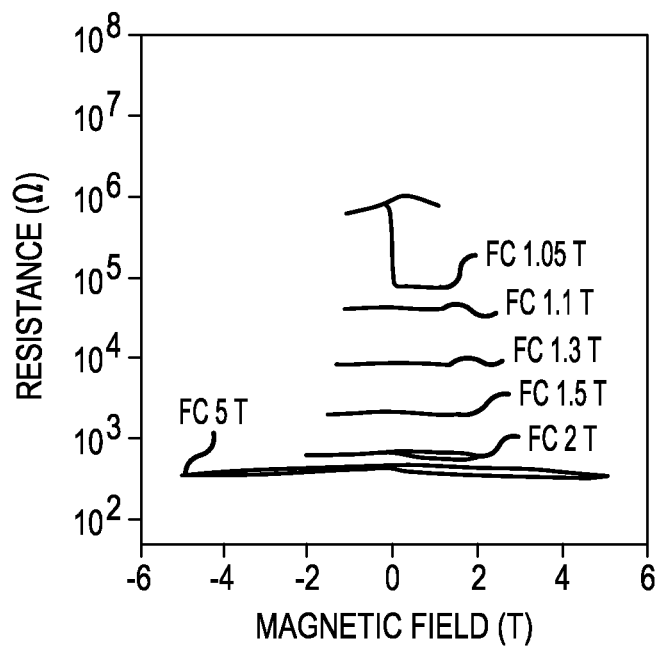
FIG. 12 is a graph of electrical resistance in magnetic sweeping after cooling with no magnetic field of a strongly correlated nonvolatile memory element in an embodiment of the invention.

In order to investigate changes in the percolation state due to an external field, a magnetic field was applied at 300 K, after which cooling to 5 K was performed, and the electrical resistance under magnetic field cooling processing was studied. FIG. 12 is a graph of the electrical resistance after magnetic field cooling of the strongly correlated nonvolatile memory 300. The curves are the results of magnetic field sweeping after magnetic field cooling measured at magnetic fields (initial magnetic fields), in order from the high resistance side, of 1.05 T, 1.1 T, 1.3 T, 1.5 T and 2 T, and the horizontal axis represents the sweeping magnetic field, shown in units of magnetic flux density. Each curve has an initial magnetic field as a starting point, and the magnetic field was swept until the magnetic field of the same intensity but opposite direction as the initial magnetic field, and was then returned again to the initial magnetic field, passing through magnetic field hysteresis. When the initial magnetic field was made 1.05 T, upon reaching zero magnetic field the electrical resistance was high, and thereafter in the magnetic field sweep the electrical resistance substantially maintained the same high value. This is thought to correspond to changes in percolation paths. When the initial magnetic field exceeded 1.05 T, as the initial magnetic field intensity increased the resistance value fell, and in all cases at initial magnetic fields of 1.1 T, 1.3 T, 1.5 T and 2 T, the resistance value was held substantially constant under zero magnetic field during sweeping. From this it is seen that phase states realizing three or more values of resistance according to percolation paths in the tuning layer 21 are stable.

Figure 13:
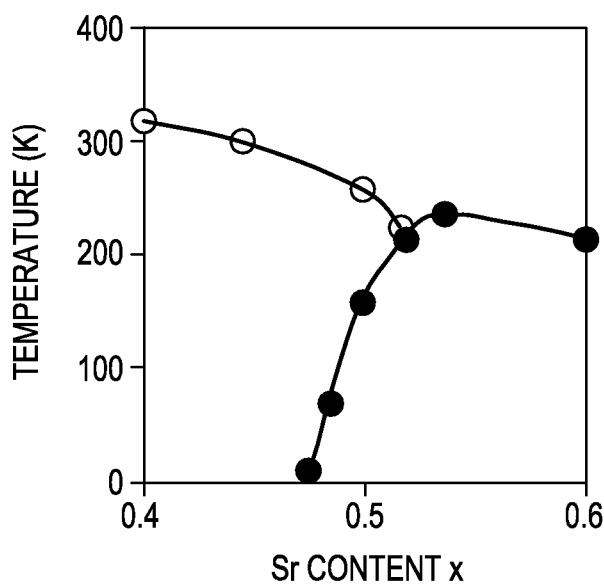
FIG. 13 is an explanatory diagram used to explain the doping behavior of a channel layer in an embodiment of the invention, and is an electronic phase diagram of $Pr_{1-x}Sr_xMnO_3$ (x=0.4 to 0.6) bulk single crystal.

Next, properties of $Pr_{1-x}Sr_xMnO_3$ (x=0.4 to 0.6) bulk single crystal are explained in relation to phase transitions in the trigger layer 22, which is of $Pr_{0.5}Sr_{0.5}MnO_3$. FIG. 13 is an explanatory diagram used to explain doping behavior of the channel layer, and is an electronic phase diagram of a $Pr_{1-x}Sr_xMnO_3$ (x=0.4 to 0.6) bulk single crystal. This corresponds to the electronic phase diagrams of FIG. 4(b) and FIG. 5 above. The vertical axis in FIG. 13 is temperature (K), and the horizontal axis represents the Sr content, that is, the hole doping content x. White circles indicate transition temperatures of a ferromagnetic phase (Curie temperatures), and black circles indicate transitions $T_N$ from a ferromagnetic phase to an antiferromagnetic phase (Wel temperature). In $Pr_{1-x}Sr_xMnO_3$, orbital ordering occurs simultaneously with a transition to an antiferromagnetic phase, and in addition carriers are localized, so that a metal-insulator transition also occurs. Hence $T_N=T_{oo}$ (orbital ordering temperature) is a temperature at which a metal-insulator transition occurs. As shown in FIG. 13, doping with electrons of $Pr_{1-x}Sr_xMnO_3$ at the composition x=0.5 corresponds, for example, to keeping the temperature at approximately 100 K while shifting leftward in FIG. 13. Consequently by doping with electrons, a metallic phase begins to appear and a transition from insulator to metal results, and the resistance falls. Doping with holes of $Pr_{1-x}Sr_xMnO_3$ at the composition x=0.5 corresponds to moving rightward in the phase diagram.

[3-3. Memory Operations]

[3-3-1. Nonvolatile Memory Functions]

Figure 14:
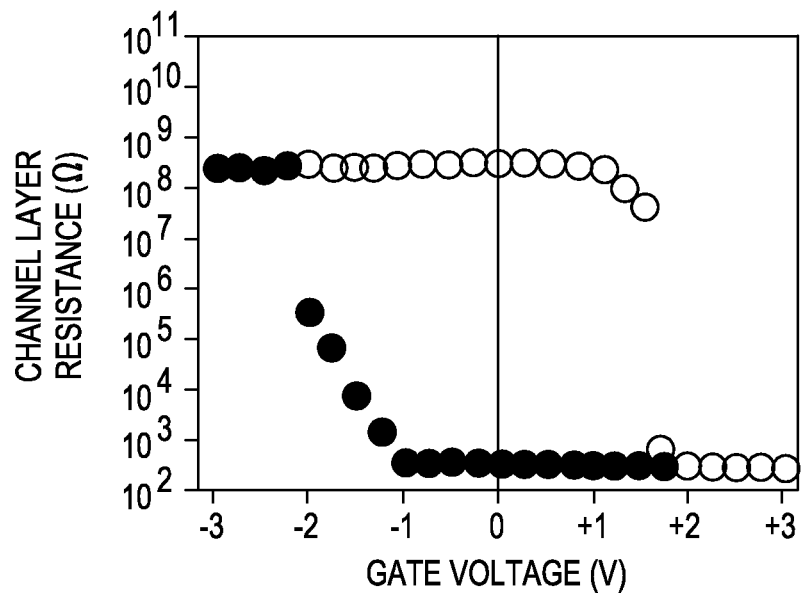
FIG. 14 is a graph of the resistance value of a channel layer versus gate voltage, in an example of a strongly correlated nonvolatile memory element in an embodiment of the invention.

Next, resistance changes and nonvolatile memory functions due to field effects are explained. FIG. 14 is a graph of channel layer resistance values versus gate voltage in an example of the strongly correlated nonvolatile memory 300. White circles and black circles respectively represent measured values of the electrical resistance for a case in which the gate voltage is raised on the positive polarity side (first polarity), and for a case in which the gate voltage is lowered on the negative polarity side (second polarity). The gate voltage is the potential of the gate electrode 41 when the source electrode 43 is at the 0 V reference voltage. In these measurements, the gate voltage was set and the electrical resistance between the source electrode 43 and the drain electrode 42 was measured; the electrical resistance value is shown as the resistance of the channel layer 2. Further, measurements were performed with the strongly correlated nonvolatile memory 300 cooled to 30 K.

In the operation in which the gate voltage is raised, the gate voltage was raised on the positive voltage side and the absolute value was increased, as indicated in the characteristics of FIG. 14. Near approximately 1.8 V, step-like behavior having a threshold was confirmed, in which the electrical resistance of the channel layer dropped sharply. Upon further applying a gate voltage to +3 V, the electrical resistance of the channel layer exhibited a change by five orders of magnitude or more compared with the state in which no gate voltage was applied. This operation is a SET operation which causes the channel layer 2 to transition to a low-resistance state (SET state) by entering the metallic phase. When a 100 μA current was passed between source and drain while lowering the gate voltage in the positive polarity range, the low-resistance SET state was maintained for cases in which the gate voltage was 1.8 V or lower and for the case in which the gate voltage was 0 V, so that exhibition of nonvolatile memory functions was confirmed.

Next, starting from the above SET state obtained by passing a 100 μA current between source and drain while setting the gate voltage to zero, the gate voltage was changed to negative polarity and a voltage applied. Then, as shown in FIG. 14, as −01 V was passed an increase in the resistance value was observed. As a negative-side voltage was further applied, increasing the voltage absolute value while maintaining negative polarity, at and above −2 V the initial high-resistance state (OFF state) reappeared. This operation is a RESET operation in which the channel layer 2 is made to transition to a high-resistance state (OFF state) by entering the insulator phase. At this time, it was confirmed that gradual behavior with a threshold of −1 V and a high-resistance state due to RESET operation are obtained. Thereafter the gate voltage was again maintained at negative polarity but raised toward 0 V, to lower the gate voltage absolute value, and during this interval and at 0 V the OFF state was maintained. That is, it was confirmed that the high-resistance state (OFF state) is maintained.

As explained above, by controlling the polarity of the gate voltage, SET operations and RESET operations could be performed, and transitions between the low-resistance state (SET state) and high-resistance state (OFF state) could be induced. Further, nonvolatile memory functions were confirmed in which both the SET state and the OFF state could be maintained in a state at a gate voltage of 0 V and with no current at all flowing in the channel layer.

[3-3-2. Multivalued Memory Functions]

[3-3-2-1. Multivalued Memory Operations in SET Operations]

Figure 15:
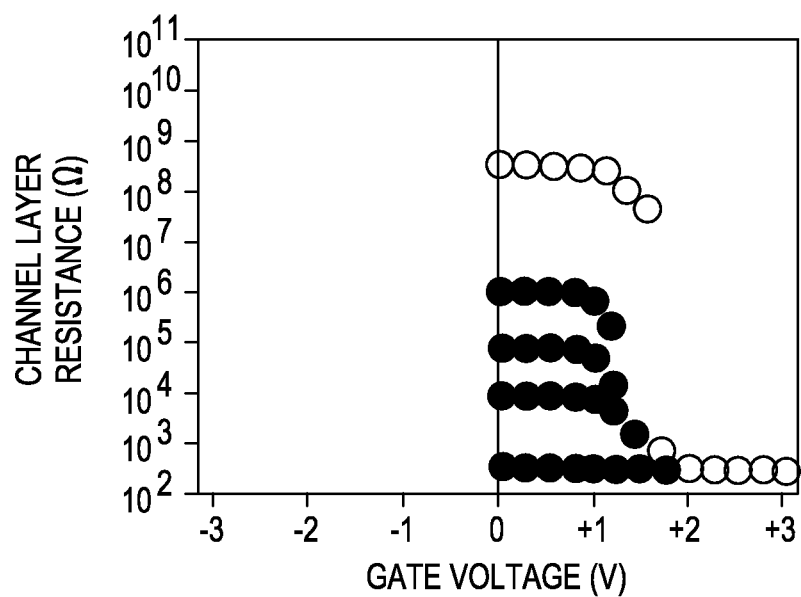
FIG. 15 is a graph showing electrical resistance controlled at multiple values by a SET operation of a strongly correlated nonvolatile memory element in an embodiment of the invention.

Under operation conditions similar to those of FIG. 14, similar measurements were performed with only the current flowing between source and drain (the source-drain current value) changed to 80 μA, 70 μA and 60 μA. FIG. 15 is a graph showing electrical resistance controlled at multiple values by SET operations on the strongly correlated nonvolatile memory element 300. For these measurements, first, in a state midway in the above-described SET operation with a +3 V gate voltage applied, while passing a source-drain current at each of the above-described values, the gate voltage was lowered past the +1.8 V threshold voltage toward 0 V. After this voltage lowering, the electrical resistance of the channel layer was measured. As a result, as shown in FIG. 15, the resistance value of the channel layer when the gate voltage was 0 V was observed to be changed according to the source-drain current value. To explain results based on specific numerical values, for source-drain current values of 80 μA, 70 μA, and 60 μA respectively, the channel layer resistance changed to approximately $10^4 \Omega$, approximately $10^5 \Omega$, and approximately $10^6 \Omega$. And, these resistance values were maintained when the source-drain current was made 0 A. Thus in a state in which the gate voltage was made 0 V, it was confirmed that multivalued resistance control in which the resistance value of the channel layer was controlled at the different respective values, was realized. When the source-drain current value was made less than 40 μA, the channel layer resistance value was approximately $10^8 \Omega$, and control of the channel layer resistance value was not possible. Hence the threshold current for the source-drain current is inferred to be in the range of 40 μA or greater and less than 60 μA. In this way, the exhibition of nonvolatile memory functions enabling multivalued storage operations was confirmed.

Physical mechanisms of the nonvolatile memory functions of such multivalued storage operations can, for a carrier content Sr, be realized by exploiting the above-described characteristics of strongly correlated oxide thin films, with a magnetic field as the external field. The quantity controlled by the gate voltage is the carrier content injected into the channel layer. That is, it was confirmed that by applying a voltage to the gate electrode, control equivalent to controlling the Sr content in FIG. 13 is realized, and operation results corresponding to horizontal movement in the electronic phase diagram of FIG. 4(b) or FIGS. 5(a)-5(e). On the other hand, phenomena similar to the behavior in FIG. 9 to FIG. 12, explained based on a magnetic field as the external field, are realized by the source-drain current in the strongly correlated nonvolatile memory 300. That is, the value of the source-drain current can be regarded as one type of external field which acts to maintain the strongly correlated oxide thin film in the metallic phase. In the explanations of the electronic phase diagrams of the above-described FIG. 4(b) or FIGS. 5(a)-5(e) also, the current value was presented as movement in an additional axis direction. Thus by adjusting the source-drain current value after a SET operation within the range equal to or greater than a threshold current, the resistance value of the channel layer after lowering the absolute value of the voltage applied to the gate electrode below the threshold voltage, or after halting voltage application, was controlled at three or more values. It was confirmed that, by combining the control of carrier content through the gate voltage with the source-drain voltage value, nonvolatile memory functions can be realized by electrical means.

Further, from the experimental results of FIG. 15, the inventor of this application considers that there is a strong possibility that the percolation explained based on FIG. 11 and FIG. 12 in particular similarly obtains when a source-drain current acts as an external field. That is, multivalued stable states originate in the state of formation of percolation paths in the tuning layer, controlled by the value of the source-drain current. Because it is possible to achieve both the above-described nonvolatility and source-drain current control, it is thought that a multivalued nonvolatile effect can be exhibited. Nonvolatile memory functions controlled by such electrical means have their origins in phase transition phenomena in strongly correlated electron systems, and so in this embodiment, these functions can be said to first be exhibited when a strongly correlated material is adopted as the material for the channel layer. The states with various electrical resistance values at a gate voltage of 0 V in FIG. 15 could be controlled according to the source-drain current by making the gate voltage a sufficiently high voltage (for example 3V) instead of making the gate voltage negative. Hence in a configuration which combines source-drain current values and SET operations, it is possible to eliminate RESET operations which are performed when transitioning to a high-resistance state, and realize nonvolatile memory functions which are multivalued, with three or more values, without making the gate voltage negative.

[3-3-2-2. Multivalued Memory Operations in RESET Operations]

Figure 16:
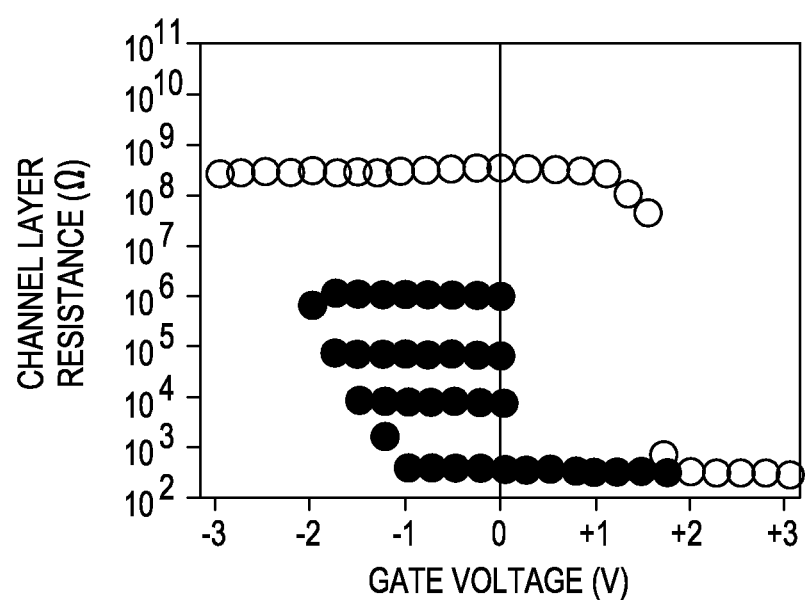
FIG. 16 is a graph showing electrical resistance controlled at multiple values by a RESET operation of a strongly correlated nonvolatile memory element in an embodiment of the invention.

As a separate method of realizing multivalued nonvolatile memory functions, control through an OFF state applied voltage value is also possible. Changes in the electrical resistance of the channel layer in such cases were measured. FIG. 16 is a graph showing the electrical resistance controlled at multiple levels by RESET operations of a strongly correlated nonvolatile memory element 300. To perform these measurements, first the gate voltage was set to zero while passing a 100 µA current between source and drain, and once the SET operation was completed, a negative gate voltage was applied and the absolute value of the gate voltage was increased. With the final gate voltage set to each of the voltage values −1 V, −1.25 V, −1.5 V and −1.75 V, the electrical resistance when the gate voltage was thereafter raised and returned to zero was measured. As shown in FIG. 16, while returning the gate voltage and when at 0 V, the channel layer electrical resistance was maintained at a resistance value corresponding to the negative-side gate final voltage value. That is, it was confirmed that by adjusting the absolute value of the gate voltage in the voltage range equal to or above the threshold voltage (1 V), the channel layer electrical resistance after the gate voltage absolute value has been lowered below the threshold voltage or gate voltage application has been halted could be controlled at three or more values. It was confirmed that by performing such operations, multivalued nonvolatile memory functions could be realized according to the applied voltage value as the OFF state final voltage.

This phenomenon corresponds to the fact that the carrier content decreases according to the negative-side final voltage value, and to the movement to the right toward x=0.5 in the electronic phase diagram of FIG. 13 as a result of this decrease in carrier content. That is, it is thought that as movement to the right toward x=0.5 occurs in the electronic phase diagram of FIG. 13, because of the change in the proportion of the metallic phase and the insulator phase in the tuning layer, changes in percolation paths occur. Multivalued storage operations by means of such RESET operations, except for a SET operation performed initially, have the advantage that control by a source-drain current as the above-described external field is not required. Hence in a RESET operation, by adjusting the applied voltage value through the gate electrode 41, the resistance value of the channel layer 2 can be controlled at three or more values after halting gate voltage application, without using control of the source-drain current value.

4. Modified Example

As explained above, by means of a strongly correlated nonvolatile memory element of this invention, nonvolatile memory functions accompanied by giant resistance changes are realized. In particular, multivalued nonvolatile memory functions are realized in strongly correlated nonvolatile memory having a channel layer comprising two layers, a tuning layer and a trigger layer.

Here, the explanation of the embodiment on which the above-described example was based was for strongly correlated nonvolatile memory 300 adopting a trigger layer 22 and a tuning layer 21 in the channel layer 2. However, the configuration of a strongly correlated memory element of this embodiment is not necessarily limited to a channel layer configured in this way, but includes strongly correlated memory elements with an arbitrary specific structure for which the operation principles described in detail obtain. For example, the bistability explained in relation to FIG. 4(*a*) also obtains in cases where a channel layer with a single-layer structure is adopted. The same is true of percolation in a two-phase coexistence state, explained in relation to FIGS. 8(*a*)-8(*c*). Hence in strongly correlated nonvolatile memories 100 and 200 explained based on FIG. 1 and FIG. 2, nonvolatile memory functions originating in bistability can be exhibited, and multivalued storage of three or more values, originating in percolation, can be realized.

Configurations of a channel layer 2 comprising two layers, a tuning layer 21 and a trigger layer 22, were explained only for the example of strongly correlated nonvolatile memory 300 (FIG. 3) with a top-gate configuration. This configuration was obtained by using a trigger layer 22 of a first type of strongly correlated oxide and a tuning layer of a second type of strongly correlated oxide to form the channel layer 2 in the strongly correlated nonvolatile memory 100 (FIG. 1), and sandwiching the gate insulator 31 between the trigger layer 22 and the gate electrode 41. However, the channel layer 2 including the tuning layer 21 and trigger layer 22 can also be adopted in strongly correlated nonvolatile memory 200 with a bottom-gate configuration (FIG. 2). In this case also, for example the channel layer 2 is formed using a trigger layer 22 of a first type of strongly correlated oxide and a tuning layer of a second type of strongly correlated oxide, configured so that the gate insulator 31 is sandwiched between the trigger layer 22 and the gate electrode 41. In both the top-gate configuration and the bottom-gate configuration, it is possible to control the channel layer 2 through control of the trigger layer 22.

In this embodiment, a substrate with a (110) plane orientation was used, but first-order transitions are also possible in a single-crystal thin film on a (210) plane orientation substrate, and so a strongly correlated oxide field effect element similarly exhibiting giant resistance change can also be realized using (210) plane orientation substrate. The materials and compositions, film thicknesses, methods of formation and similar of the thin films and substrate described in examples of this embodiment are not limited to those in the above embodiments.

In the above, the embodiments and examples of the invention have been specifically explained. Examples in each of the above-described embodiments have been presented to explain the invention, but the scope of the invention of this application should be determined based on the scope of claims. Modified examples within the scope of the invention, including other combinations of the embodiments, are included in the scope of claims.

Strongly correlated nonvolatile memory of this invention can be used in arbitrary electrical and electronic devices which use elements exhibiting nonvolatile switching functions by electrical means.

What is claimed is:

1. A strongly correlated nonvolatile memory element, comprising, on a substrate:
   a channel layer including a strongly correlated oxide thin film;
   a gate electrode;
   a gate insulator formed in contact with at least a portion of a surface or interface of the channel layer and sandwiched between the channel layer and the gate electrode; and
   a source electrode and a drain electrode formed in contact with at least a portion of the channel layer, wherein the channel layer includes a perovskite type manganite which can undergo transitions between a metallic phase and an insulator phase, which is either a charge-ordered phase or an orbital-ordered phase, the channel layer is formed of a trigger layer of a first type strongly correlated oxide and a tuning layer of a second type strongly correlated oxide, and the trigger layer and the tuning layer are disposed by stacking one on the other.

2. The strongly correlated nonvolatile memory element according to claim 1, wherein the channel layer, the gate insulator, and the gate electrode are formed, in order, on top of the substrate.

3. The strongly correlated nonvolatile memory element according to claim 1, wherein the gate electrode, the gate insulator, and the channel layer are formed, in order, on top of the substrate.

4. The strongly correlated nonvolatile memory element according to claim 1, wherein the trigger layer is sandwiched between the gate insulator and the tuning layer.

5. The strongly correlated nonvolatile memory element according to claim 1, wherein the thickness t of the channel layer, the thickness t1 of the trigger layer, and the thickness t2 of the tuning layer satisfy, with respect to the critical film thicknesses t1c and t2c for a metallic phase in the trigger layer and in the tuning layer respectively, the relation $$t=t1+t2\geq \max(t1c,t2c)$$

where t1<t1c and t2<t2c, and max( ) is a function which returns the maximum value of the group of variables.

6. The strongly correlated nonvolatile memory element according to claim 1, wherein a plane orientation of the substrate is a (110) plane orientation or a (210) plane orientation.

7. A strongly correlated nonvolatile memory element, comprising, on a substrate:

a channel layer including a strongly correlated oxide thin film;

a gate electrode;

a gate insulator formed in contact with at least a portion of a surface or interface of the channel layer and sandwiched between the channel layer and the gate electrode; and a source electrode and a drain electrode formed in contact with at least a portion of the channel layer, wherein the channel layer includes a perovskite type manganite which can undergo transitions between a metallic phase and an insulator phase, which is either a charge-ordered phase or an orbital-ordered phase, and, after a SET operation, in which a voltage of a first polarity exhibiting an absolute value which is equal to or greater than a threshold voltage is applied to the gate electrode and a resistance value of the channel layer is lowered, with a source-drain current between the source electrode and the drain maintained at a threshold current or higher, the voltage on the gate electrode, while retaining the first polarity, is controlled such that an absolute value thereof is lowered below the threshold voltage, or, the application of the voltage is halted, whereby a resistance value of the channel layer becomes a value lower than a value prior to the SET operation.

8. The strongly correlated nonvolatile memory element according to claim 7, wherein, by adjusting a value of the source-drain current after the SET operation to be within a range equal to or greater than the threshold current, after an absolute value of a voltage applied to the gate electrode is lowered below the threshold voltage, or after voltage application is halted, a resistance value of the channel layer is controlled at three or more values.

9. A strongly correlated nonvolatile memory element, comprising, on a substrate:

a channel layer including a strongly correlated oxide thin film;

a gate electrode;

a gate insulator formed in contact with at least a portion of a surface or interface of the channel layer and sandwiched between the channel layer and the gate electrode; and a source electrode and a drain electrode formed in contact with at least a portion of the channel layer, wherein the channel layer includes a perovskite type manganite which can undergo transitions between a metallic phase and an insulator phase, which is either a charge-ordered phase or an orbital-ordered phase, and, after a RESET operation, in which a voltage of a second polarity exhibiting an absolute value which is equal to or greater than a threshold voltage is applied to the gate electrode and a resistance value of the channel layer is raised, the voltage on the gate electrode, while retaining the second polarity, is controlled such that an absolute value thereof is lowered below the threshold voltage, or, the application of the voltage is halted, whereby a resistance value of the channel layer becomes a value higher than a value prior to the RESET operation.

10. The strongly correlated nonvolatile memory element according to claim 9, wherein, by adjusting a value of a voltage applied to the gate electrode in the RESET operation such that an absolute value thereof is within a voltage range equal to or greater than the threshold voltage, after an absolute value of a voltage applied to the gate electrode is lowered below the threshold voltage, or after voltage application is halted, a resistance value of the channel layer is controlled at three or more values.

* * * * *